(12) United States Patent
Kim et al.

(10) Patent No.: US 10,263,006 B2
(45) Date of Patent: Apr. 16, 2019

(54) SEMICONDUCTOR MEMORY DEVICES

(71) Applicant: Samsung Electronics Co., Ltd., Suwon-si, Gyeonggi-do (KR)

(72) Inventors: Sung Gil Kim, Yongin-si (KR); Ji-Hoon Choi, Seongnam-si (KR); Dongkyum Kim, Suwon-si (KR); Jintae Noh, Yongin-si (KR); Seulye Kim, Seoul (KR); Hong Suk Kim, Yongin-si (KR); Phil Ouk Nam, Suwon-si (KR); Jaeyoung Ahn, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/480,983

(22) Filed: Apr. 6, 2017

(65) Prior Publication Data

US 2018/0097006 A1 Apr. 5, 2018

(30) Foreign Application Priority Data

Oct. 5, 2016 (KR) ........................ 10-2016-0128216

(51) Int. Cl.
| | |
|---|---|
| *H01L 27/11556* | (2017.01) |
| *H01L 27/11582* | (2017.01) |
| *H01L 29/08* | (2006.01) |
| *H01L 29/10* | (2006.01) |
| *H01L 27/1157* | (2017.01) |
| *H01L 29/423* | (2006.01) |

(52) U.S. Cl.
CPC .... *H01L 27/11556* (2013.01); *H01L 27/1157* (2013.01); *H01L 27/11582* (2013.01); *H01L 29/0847* (2013.01); *H01L 29/1037* (2013.01); *H01L 29/4234* (2013.01); *H01L 29/42324* (2013.01); *H01L 29/42364* (2013.01)

(58) Field of Classification Search
CPC ......... H01L 27/11556; H01L 27/11582; H01L 29/0847; H01L 29/1037
See application file for complete search history.

(56) References Cited

U.S. PATENT DOCUMENTS

| | | | |
|---|---|---|---|
| 8,344,385 | B2 | 1/2013 | Kim et al. |
| 9,064,736 | B2 | 6/2015 | Lee et al. |
| 9,130,054 | B2 | 9/2015 | Jang et al. |
| 9,230,980 | B2 | 1/2016 | Rabkin et al. |

(Continued)

FOREIGN PATENT DOCUMENTS

KR 1020140093106 A 7/2014

*Primary Examiner* — Cuong Q Nguyen
(74) *Attorney, Agent, or Firm* — Myers Bigel, P.A.

(57) ABSTRACT

A semiconductor memory device may include: a stacking structure including a plurality of insulating layers and a plurality of gate electrodes alternately stacked on a substrate; a lower semiconductor pattern that protrudes from the top of the substrate; a vertical insulating pattern that extends in a vertical direction from the substrate and penetrates the stacking structure; and a vertical channel pattern on the inner surface of the vertical insulating pattern and contacting the lower semiconductor pattern, wherein an upper part of the lower semiconductor pattern includes a recess region including a curve-shaped profile, and in the recess region, the outer surface of a lower part of the vertical channel pattern contacts the lower semiconductor pattern along a curve of the recess region.

19 Claims, 37 Drawing Sheets

(56) References Cited

U.S. PATENT DOCUMENTS

| | | |
|---|---|---|
| 9,356,043 B1 | 5/2016 | Sakakibara et al. |
| 9,768,117 B1* | 9/2017 | Naito ................ H01L 27/11582 |
| 2015/0137210 A1 | 5/2015 | Nam et al. |
| 2016/0043100 A1 | 2/2016 | Lee et al. |
| 2016/0276365 A1* | 9/2016 | Choi ................ H01L 27/11582 |
| 2017/0092733 A1* | 3/2017 | Makala ............ H01L 27/11556 |
| 2017/0236836 A1* | 8/2017 | Huo ................ H01L 27/11582 |
| | | 257/324 |

* cited by examiner

FIG. 2C
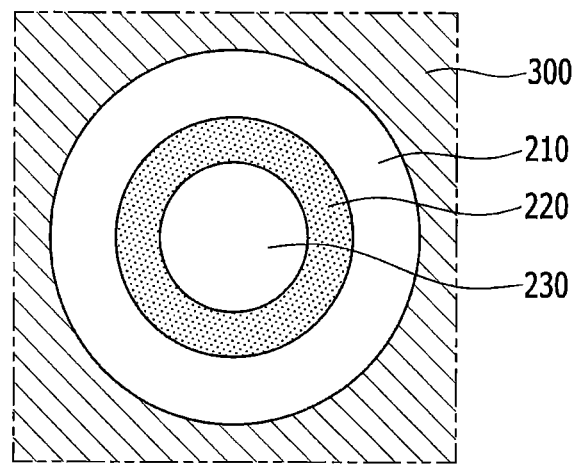
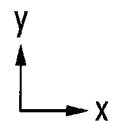

SEMICONDUCTOR MEMORY DEVICES

CROSS-REFERENCE TO RELATED APPLICATION

This application claims the benefit of priority under 35 U.S.C. § 119 to Korean Patent Application No. 10-2016-0128216 filed in the Korean Intellectual Property Office on Oct. 5, 2016, the entire contents of which are incorporated herein by reference.

BACKGROUND

(a) Field

The present inventive concepts relate to semiconductor memory devices.

(b) Description of the Related Art

The price and performance demands of consumers have created an increasing need for semiconductor memory devices with improved integrity. In the case of 2D or planar semiconductor memory devices, since the integrity can be determined, in part, by an area occupied by a unit memory cell, the integrity may be influenced by a level of a micro pattern forming technology. However, since the equipment used for micronization of a pattern can be expensive, the integrity of the 2D semiconductor memory devices may be limited.

SUMMARY

The present inventive concepts provide semiconductor memory devices having improved reliability.

The present inventive concepts are not limited to the aforementioned technical object, and other technical objects, which are not mentioned above, will be appreciated by a person having ordinary skill in the art from the following description.

An example embodiment of the present inventive concepts provides a semiconductor memory device including: a stacking structure including a plurality of insulating layers and a plurality of gate electrodes alternately stacked on a substrate; a lower semiconductor pattern that protrudes from the substrate; a vertical insulating pattern that extends in a vertical direction from the substrate and penetrates the stacking structure; and a vertical channel pattern on an inner surface of the vertical insulating pattern and contacting the lower semiconductor pattern, wherein an upper part of the lower semiconductor pattern includes a recess region including a curve-shaped profile, and in the recess region, an outer surface of a lower part of the vertical channel pattern contacts the lower semiconductor pattern along a curve of the recess region.

Another example embodiment of the present inventive concepts provides a semiconductor memory device including: a stacking structure including a plurality of insulating layers and a plurality of gate electrodes alternately stacked on a substrate; a lower semiconductor pattern that protrudes from the substrate; a vertical insulating pattern which extends in a vertical direction to the substrate and penetrates the stacking structure; and a vertical channel pattern positioned on an inner surface of the vertical insulating pattern and contacting the lower semiconductor pattern, wherein the lower semiconductor pattern includes a first region doped with a first impurity, and a second region doped with a second impurity having the same conductive type as the substrate.

Another example embodiment of the present inventive concepts provides a semiconductor memory device including a substrate, a stacking structure comprising a plurality of insulating layers and a plurality of gate electrodes alternately stacked on the substrate, a lower semiconductor pattern extending in a first direction from the substrate, a vertical channel pattern on the lower semiconductor pattern and extending in the first direction from within a recess region of the lower semiconductor pattern, and a vertical insulating pattern extending in the first direction between the vertical channel pattern and the stacking structure. A first region of the lower semiconductor pattern may include a first impurity. A second region of the lower semiconductor pattern between the first region and the substrate may include a second impurity different from the first impurity.

According to example embodiments of the present inventive concepts, since semiconductor memory devices may include a vertical channel pattern having a small thickness, electron mobility of a channel can increase and electrical characteristics of the semiconductor memory devices can be improved.

Further, a lower semiconductor pattern may be inhibited or prevented from being excessively etched during a manufacturing process to reduce or prevent disconnection of the vertical channel pattern having the small thickness, which contacts the lower semiconductor pattern. As a result, semiconductor memory devices having improved reliability can be provided.

BRIEF DESCRIPTION OF THE DRAWINGS

The above and other aspects, features and other advantages of the present inventive concepts will be more clearly understood from the following detailed description when taken in conjunction with the accompanying drawings, in which:

FIG. 2C is a cross-sectional view taken along line C-C of FIG. 2B.

DETAILED DESCRIPTION

Figure 1:
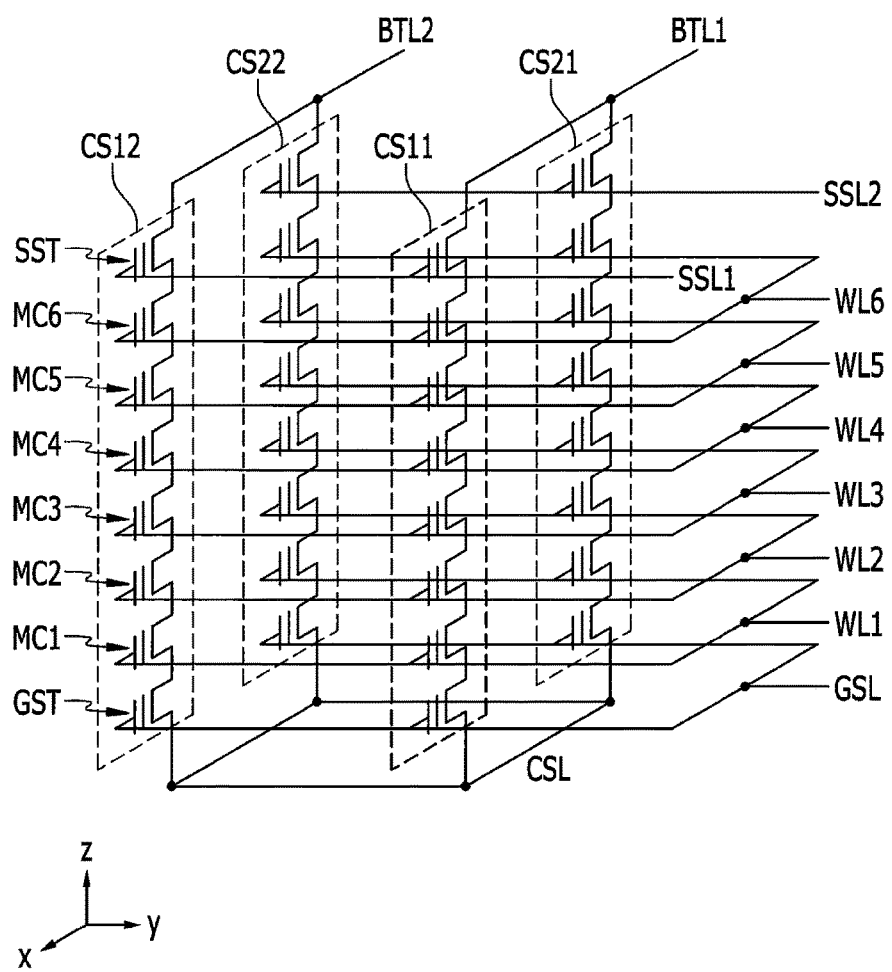
FIG. 1 is a schematic circuit diagram illustrating a 3D semiconductor memory cell array according to an example embodiment of the present inventive concepts.

FIG. 1 is a schematic circuit diagram illustrating a 3D semiconductor memory cell array according to an example embodiment of the present inventive concepts.

Referring to FIG. 1, the memory cell array may include a plurality of cell strings CS11, CS12, CS21, and CS22 which extend in a vertical direction. The plurality of cell strings may have a vertical structure in which the plurality of cell strings extend in a perpendicular direction (e.g., a z direction) to a plane of a substrate upon which the plurality of cell strings are formed.

The plurality of cell strings CS11, CS12, CS21, and CS22 may include a ground selection transistor GST, a plurality of memory cell transistors MC1, MC2, . . . , MC6, and a string selection transistor SST which are connected in series, respectively. In FIG. 1, it is illustrated that each of the cell strings CS11, CS12, CS21, and CS22 has one string selection transistor SST, but the present inventive concepts are not limited thereto. Further, it is illustrated that each of the cell strings CS11, CS12, CS21, and CS22 has 6 memory cell transistors MC1, MC2, . . . , MC6, but each of the cell strings CS11, CS12, CS21, and CS22 may include at least 8 memory cell transistors MCx and the present inventive concepts are not limited thereto.

The plurality of cell strings CS11, CS12, CS21, and CS22 may be connected while being arranged in a matrix. The string selection transistor SST of each of the cell strings CS11, CS12, CS21, and CS22 may be connected with corresponding bit lines BTL1 and BTL2. For example, the cell strings CS11 and CS21 commonly connected to the first bit line BTL1 may be arrayed along a first column, and the cell strings CS12 and CS22 commonly connected to the second bit line BTL2 may be arrayed along a second column. The string selection transistor SST of each of the cell strings CS11, CS12, CS21, and CS22 may be connected with string selection lines SSL1 and SSL2. For example, the cell strings CS11 and CS12 commonly connected to the first string selection line SSL1 may be arrayed along a first row, and the cell strings CS21 and CS22 commonly connected to the second string selection line SSL2 may be arrayed along a second row.

The ground selection transistor GST of each of the cell strings CS11, CS12, CS21, and CS22 may be connected with the ground selection line GSL. A common source line CSL may be connected with the ground selection transistor GST of each of the cell strings CS11, CS12, CS21, and CS22.

Memory cell transistors MC1, MC2, . . . , MC6 positioned at the same height may be connected to word lines WL1, WL2, . . . , WL6 positioned at the same height, respectively.

For example, the first memory cell transistor MC1 connected with the ground selection transistor GST may be connected with the first memory cell transistor MC1 of an adjacent column through the first word line WL1.

The common source line CSL may be commonly connected to a source of the ground selection transistor GST. In addition, the ground selection line GSL, the plurality of word lines WL1, WL2, WL6, and the string selection lines SSL1 and SSL2 disposed between the common source line CSL and the bit lines BTL1 and BTL2 may be used as gate electrodes of the ground selection transistor GST, the memory cell transistors MC1, MC2, . . . , MC6, and the string selection transistor SST, respectively. Further, each of the memory cell transistors MC1, MC2, . . . , MC6 may include a data storage element.

Figure 2A:
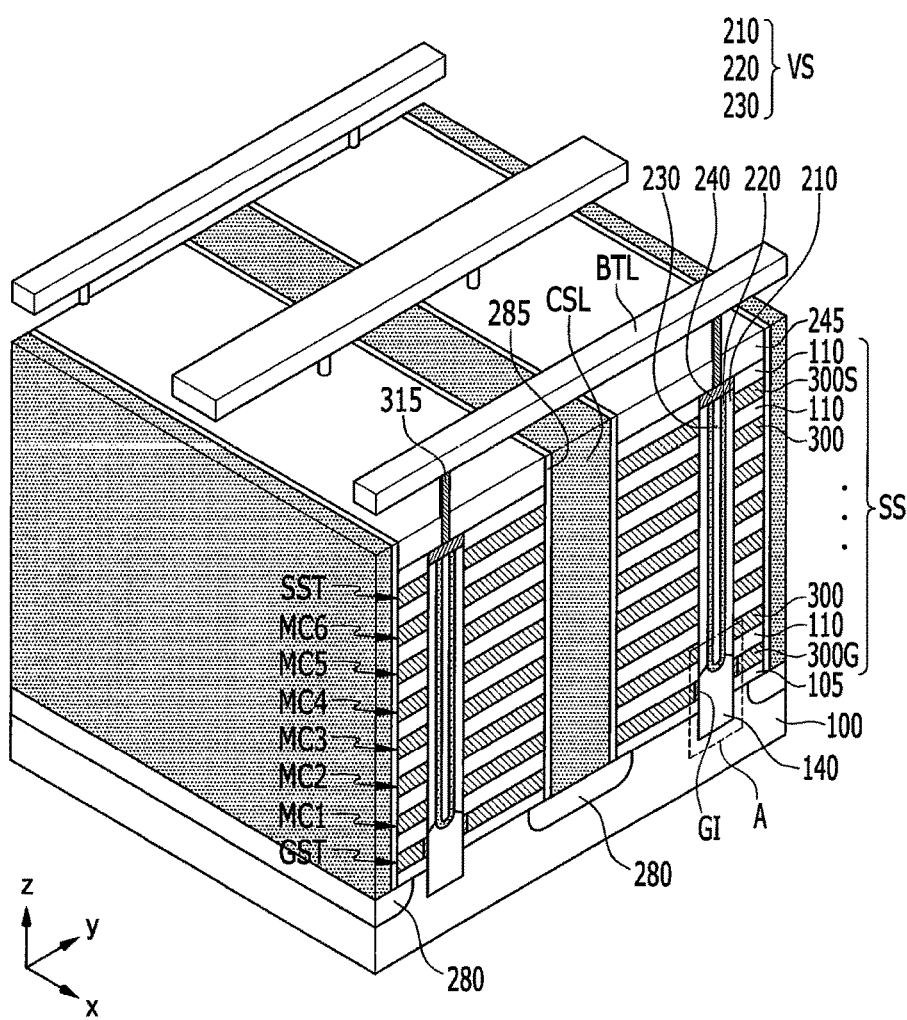
FIG. 2A is a perspective view illustrating a part of a semiconductor memory device according to an example embodiment of the present inventive concepts.

Hereinafter, a semiconductor memory device according to an example embodiment of the present inventive concepts will be described with reference to FIGS. 2A and 2B. FIG. 2A is a perspective view illustrating a part of a semiconductor memory device according to an example embodiment of the present inventive concepts, FIG. 2B is an enlarged diagram of region A of FIG. 2A, and FIG. 2C is a cross-sectional view taken along line C-C of FIG. 2B.

Figure 2B:
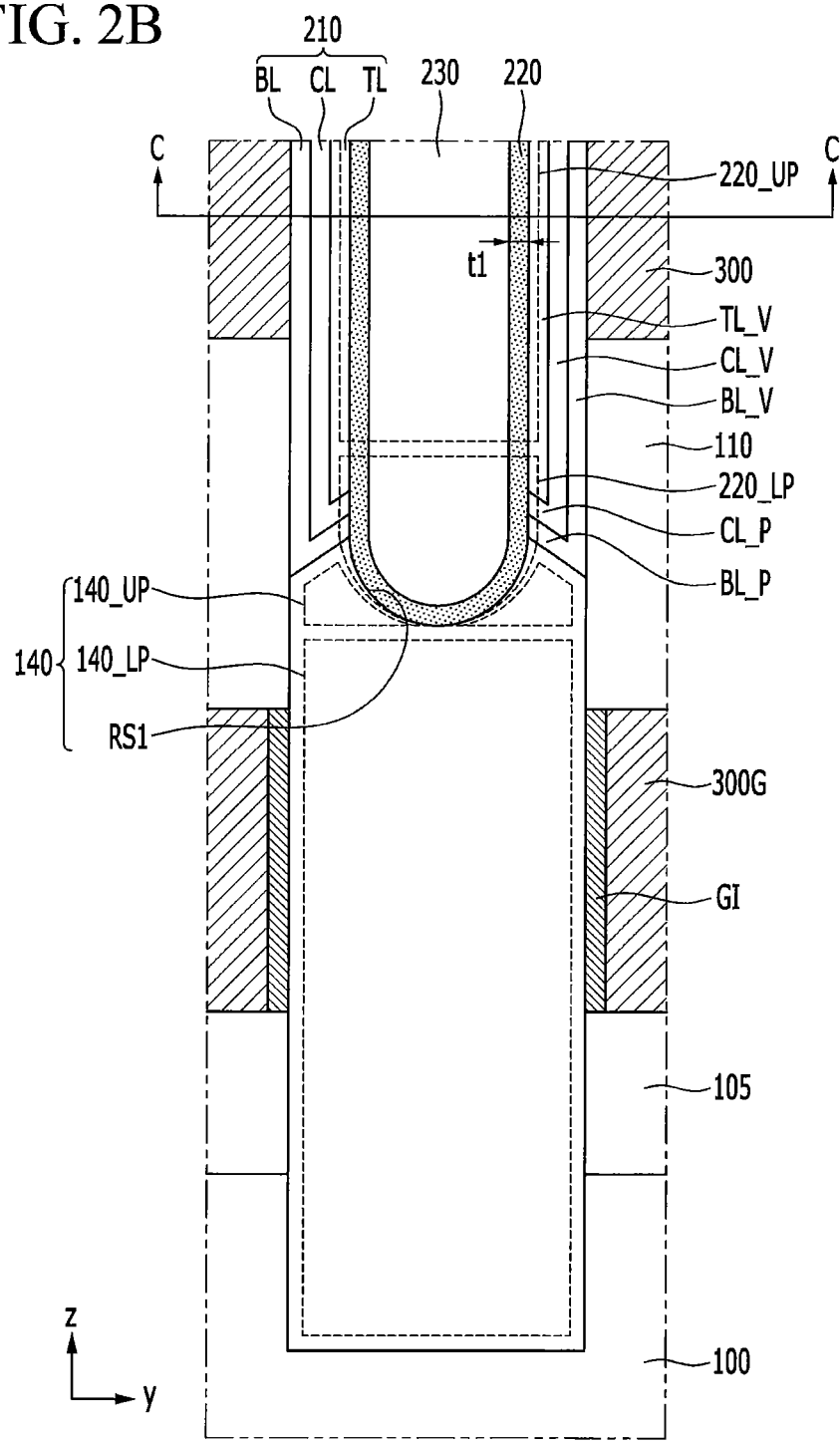
FIG. 2B is an enlarged diagram of region A of FIG. 2A.

Referring to FIGS. 2A and 2B, the semiconductor memory device according to the example embodiment may include a substrate 100 containing a semiconductor material. The substrate 100 may be, for example, a silicon substrate, a germanium substrate, a silicon-germanium substrate, or a silicon-on-insulator (SOI) substrate. The substrate 100 may include an impurity such as, for example, a P type impurity.

The substrate 100 may include a common source region 280 doped with the impurity. The common source region 280 may extend in an x direction parallel to the top of the substrate 100. A plurality of common source regions 280 may be arranged in a y direction orthogonal to the x direction. The common source region 280 may include, for example, an N type impurity injected in the substrate 100.

A stacking structure SS in which a plurality of insulating layers 110 and a plurality of gate electrodes 300 are alternately stacked is positioned on the substrate 100. A plurality of stacking structures SS may be provided, but hereinafter, one stacking structure SS will be primarily described.

With respect to an xy-direction plane, the stacking structure SS may extend in the x direction and the common source regions 280 may be positioned at both sides of the stacking structure SS. The stacking structure SS and the common source region 280 may be alternately positioned in the y direction.

The common source line CSL may be positioned between adjacent stacking structures SS and may penetrate the plurality of gate electrodes 300 and the plurality of insulating layers 110 in a direction (e.g., a z direction) perpendicular to the top of the substrate 100.

The common source line CSL may contact the substrate 100 and, in detail, contact the common source region 280 included in the substrate 100. A trench spacer 285 disposed between the common source line CSL and the gate electrode 300 may electrically insulate the common source line CSL and the gate electrode 300 adjacent to each other in the y direction. A lower insulating layer 105 may be positioned between the substrate 100 and the stacking structure SS. The lower insulating layer 105 may include a high dielectric layer such as a silicon nitride layer, an aluminum oxide layer, and/or a hafnium oxide layer. The lower insulating layer 105 may have a smaller thickness than the insulating layer 110.

The plurality of gate electrodes 300 may be stacked in the z direction perpendicular to the top of the substrate 100. The plurality of gate electrodes 300 may be spaced apart from each other in the z direction by the plurality of insulating layers 110 positioned between respective ones of the plurality of gate electrodes 300.

A gate electrode 300G positioned on a lowermost end (e.g., closest to the substrate 100) among the plurality of gate electrodes 300 may be a ground selection line of the ground selection transistor GST described with reference to FIG. 1. A gate electrode 300S positioned on an uppermost end (e.g., farthest from the substrate 100) among the plurality of gate electrodes 300 may be a string selection line of the string selection transistor SST described with reference to FIG. 1. The plurality of gate electrodes 300 positioned between the gate electrode 300G at the lowermost end and the gate electrode 300S at the uppermost end may be the word lines of the memory cell transistors MCx described with reference to FIG. 1.

The plurality of gate electrodes 300 may include doped silicon, metal (e.g., tungsten, copper, and/or aluminum), metal nitride (e.g., titanium nitride, tantalum nitride, and the like), metal silicide, or a combination thereof. The plurality of insulating layers 110 may include a silicon oxide layer.

A lower semiconductor pattern 140 may protrude from the top of the substrate 100. The substrate 100 may include a recess region depressed from the top of the substrate 100 and the lower semiconductor pattern 140 may be positioned to protrude on the top of the substrate 100 from the recess region. The lower semiconductor pattern 140 may protrude from the substrate 100 so as to penetrate the lower insulating layer 105 and the gate electrode 300G positioned at the lowermost end among the plurality of gate electrodes 300. The lower semiconductor pattern 140 may partially penetrate the insulating layer 110 positioned on the gate electrode 300G positioned at the lowermost end among the plurality of gate electrodes 300. The top of the lower semiconductor pattern 140 may be positioned at a level between the bottom and the top of the insulating layer 110 positioned on the gate electrode 300G positioned at the lowermost end among the plurality of gate electrodes 300.

A gate insulating layer GI may be positioned between the lower semiconductor pattern 140 and the gate electrode 300G positioned at the lowermost end. The gate insulating layer GI may be an oxide layer formed by performing an oxidation process in the lower semiconductor pattern 140 of which an exterior surface is exposed during a manufacturing process. In some embodiments, the gate insulating layer GI may be optional.

The lower semiconductor pattern 140 may be a semiconductor having conductivity (for example, a p type) such as the substrate 100 or an intrinsic semiconductor. The lower semiconductor pattern 140 may be formed by using the substrate 100 as a seed. In some embodiments, the lower semiconductor pattern 140 may contain a single crystal structure or polycrystalline structure semiconductor material. As one example, the lower semiconductor pattern 140 may include silicon.

Since the lower semiconductor pattern 140 may be formed by performing an epitaxial growth (SEG) process using the semiconductor material, the tops of the lower semiconductor patterns 140 may have a curvature which is not 0 (zero). The lower semiconductor pattern 140 may have the top which is convex upward. In detail, the plane (e.g., xy-direction plane) of the lower semiconductor pattern 140 may include an upper part 140_UP of which a width decreases as the distance from the substrate 100 increases (e.g., toward the z direction) and a lower part 140_LP positioned below the upper part 140_UP. In some embodiments, as illustrated in FIG. 2B, an upper surface of the upper part 140_UP of the lower semiconductor pattern 140 may incline upwards from an outer edge of the upper part 140_UP (e.g. an edge closest to the stacked structure SS) away from the substrate 100. The lower part 140_LP may have a substantially uniform width.

The lower semiconductor pattern 140 may include a first recess region RS1 within the upper part 140_UP. A yz-direction cross section of the first recess region RS1 may have a curve-shaped profile. The first recess region RS1 may have a concave curve-shaped profile in which a width decreases toward the substrate 100.

A plurality of vertical pattern structures VS may be connected with the lower semiconductor pattern 140 by penetrating the stacking structure SS. The vertical pattern structures VS may be arranged in the x direction on the xy-direction plane. For example, the vertical patterns structures VS may be arranged in zigzag in the x direction, but the present inventive concepts are not limited thereto. Further, the vertical pattern structures VS may be surrounded by the stacking structure SS in the xy-direction plane.

Each of the vertical pattern structures VS may include a vertical channel pattern 220 connected with the lower semiconductor pattern 140, a vertical insulating pattern 210 positioned between the vertical channel pattern 220 and the stacking structure SS, and a filling insulating pattern 230 within and/or filling an inner region of the vertical channel pattern 220.

A conductive pad 240 may be connected to the vertical pattern structure VS by penetrating the stacking structure SS. The top of the conductive pad 240 may be substantially coplanar with the top of the stacking structure SS and the bottom of the conductive pad 240 may directly contact the vertical pattern structure VS. The conductive pad 240 may include doped polysilicon and/or metal.

The bit line BTL crossing a capping layer 245 and the stacking structure SS may be positioned on the stacking structure SS. The bit line BTL may be connected with the conductive pad 240 through a bit line contact 315 penetrating the capping layer 245.

Referring to FIG. 2B, the vertical insulating pattern 210 may include a blocking insulating layer BL, a charge storing layer CL, and a tunnel insulating layer TL sequentially stacked on the inner surface of the stacking structure SS.

The blocking insulating layer BL may directly contact the inner surface (e.g., one side wall) of the plurality of gate electrodes 300 and the plurality of insulating layers 110 and directly contact the upper part 140_UP of the lower semiconductor pattern 140. In some embodiments, the blocking insulating layer BL may not contact the first recess region RS1 in the upper part 140_UP of the lower semiconductor pattern 140. The tunnel insulating layer TL may directly contact an outer surface of the vertical channel pattern 220 while surrounding the outer periphery of the vertical channel pattern 220.

In some embodiments, the charge storing layer CL may include at least one of a silicon nitride layer, a silicon oxynitride layer, a silicon (Si)-rich nitride layer, nanocrystalline silicon (Si), and a laminated trap player. The tunnel insulating layer TL may contain a material having a larger band gap than the charge storing layer CL. In some embodiments, the tunnel insulating layer TL may be a silicon oxide layer. The blocking insulating layer BL may contain a material having a larger energy band gap than the charge storing layer CL. In some embodiments, the blocking insulating layer BL may be a silicon oxide layer, a silicon oxynitride layer, an aluminum oxide layer, and/or a hafnium oxide layer.

The blocking insulating layer BL may include a vertical part BL_V which extends in the z direction and a protrusion BL_P which extends toward the vertical channel pattern 220 from the bottom of the vertical part BL_V. The protrusion BL_P of the blocking insulating layer BL may directly contact the top of the upper part 140_UP of the lower semiconductor pattern 140. In some embodiments, the protrusion BLP of the blocking insulating layer BL may not contact the first recess region RS1 in the upper part 140_UP of the lower semiconductor pattern 140. In some embodiments, the protrusion BLP of the blocking insulating layer BL may be inclined on the top of the upper part 140_UP of the lower semiconductor pattern 140. In detail, the protrusion BL_P of the blocking insulating layer BL may have a profile in which the protrusion BL_P is inclined away from the substrate 100 toward the vertical channel pattern 220 from a part connected with the vertical part BL_V.

The charge storing layer CL may include a vertical part CL_V which extends in the z direction and a protrusion CL_P which extends toward the vertical channel pattern 220 from the bottom of the vertical part CL_V. The bottom of the protrusion CL_P of the charge storing layer CL may directly contact the top of the protrusion BL_P of the blocking insulating layer BL. The protrusion CL_P of the charge storing layer CL may have a profile in which the protrusion CL_P is inclined along the protrusion BL_P of the blocking insulating layer BL. In detail, the protrusion CL_P of the charge storing layer CL may have a profile in which the protrusion CL_P is inclined away from the substrate 100 toward the vertical channel pattern 220 from a part connected with the vertical part CL_V.

The tunnel insulating layer TL may include a vertical part TL_V which extends in the z direction. The bottom of the vertical part TL_V of the tunnel insulating layer TL may directly contact the top of the protrusion CL_P of the charge storing layer CL. The bottom of the vertical part TL_V of the tunnel insulating layer TL may have a profile in which the bottom is inclined like the top of the protrusion CL_P of the charge storing layer CL. In this case, the tunnel insulating layer TL does not substantially include the protrusion like the charge storing layer CL and the blocking insulating layer BL.

The inner surface (e.g. the surface closest to the vertical channel pattern 220) of the protrusion BL_P of the blocking insulating layer BL, the inner surface of the protrusion CL_P of the charge storing layer CL, and the inner surface of the vertical part TL_V of the tunnel insulating layer TL may be substantially coplanar. The blocking insulating layer BL, the charge storing layer CL, and the tunnel insulating layer TL may be etched in the same process so that edges of the respective layers are substantially coplanar.

The vertical channel pattern 220 may be positioned on the lower semiconductor pattern 140 and may have a pipe shape in which one end is closed, a hollow cylindrical shape in which one end is closed, or a cup shape, though the present inventive concepts are not limited thereto.

An upper part 220_UP of the vertical channel pattern 220 may have the pipe shape in which the upper part 220_UP directly contacts the inner surface of the tunnel insulating layer TL. A lower part 220_LP of the vertical channel pattern 220 may have the cup shape in which the lower part 220_LP directly contacts the lower semiconductor pattern 140 by penetrating the tunnel insulating layer TL, the charge storing layer CL, and the blocking insulating layer BL.

The lower part 220_LP of the vertical channel pattern 220 may contact the upper part 140_UP of the lower semiconductor pattern 140. In some embodiments, the bottom of the lower part 220_LP of the vertical channel pattern 220 may contact the upper part 140_UP of the lower semiconductor pattern 140 in the first recess region RS1. The first recess region RS1 may have a curve shape, and the outer surface of the lower part 220_LP of the vertical channel pattern 220 contacting the first recess region RS1 may have the curve shape. The vertical channel pattern 220 may contact the lower semiconductor pattern 140 along the curve.

A lowermost end of the lower part 220_LP of the vertical channel pattern 220 may be positioned at a higher level (e.g. farther from the substrate 100) than the top of the gate electrode 300G positioned at the lowermost end of the plurality of gate electrodes 300. A distance from the lowermost end of the lower part 220_LP of the vertical channel pattern 220 to the substrate 100 may be larger than a distance from the top of the gate electrode 300G positioned at the lowermost end to the substrate 100.

The outer surface of the lower part 220_LP of the vertical channel pattern 220 may contact the inner surface of the vertical part TL_V of the tunnel insulating layer TL, the inner surface of the protrusion CL_P of the charge storing layer CL, and the inner surface of the protrusion BL_P of the blocking insulating layer BL.

The lower part 220_LP of the vertical channel pattern 220 may have a profile in which the width decreases toward the substrate 100. Since the outer surface of the lower part 220_LP of the vertical channel pattern 220 directly contacts the first recess region RS1, the outer surface may have a curve profile corresponding to the first recess region RS1.

Further, as illustrated in FIG. 2C, the edge of the outer surface of the xy-direction cross section of the vertical channel pattern 220 and the edge of the inner surface of the xy-direction cross section of the vertical insulating pattern 210 may match each other. In particular, the edge of the outer surface of the xy-direction cross section of the vertical channel pattern 220 and the edge of the inner surface of the xy-direction cross section of the tunnel insulating layer TL may match each other. This may be due to the fact that the shape of the vertical channel pattern 220 vertically has the same thickness throughout the upper and lower parts of the vertical channel pattern 220 and the tunnel insulating layer TL in the vertical insulating pattern 210 does not include a separate protrusion.

The vertical channel pattern 220 may be a single layer having the same thickness t1 throughout the upper part 220_UP and the lower part 220_LP. Since the vertical channel pattern 220 may have a relatively small thickness t1, a grain boundary in the vertical channel pattern 220 may be reduced. When the grain boundary of the vertical channel pattern 220 is reduced, a movement path of electrons may be shortened and a trap site may also be reduced. Consequently, electron mobility of the channel may increase, and, as a result, electrical characteristics (e.g., an operation speed) of the device may be improved.

The vertical channel pattern 220 may include single crystal silicon, polycrystalline silicon, and/or amorphous silicon. In some embodiments, the vertical channel pattern 220 may be in an undoped state or be doped with impurities having the same conductive type as the substrate 100. The vertical channel pattern 220 may include a semiconductor material having a polycrystalline structure or a single crystal structure. In some embodiments, the vertical channel pattern 220 may include silicon.

The filling insulating pattern 230 may fill the inside of the vertical channel pattern 220. The filling insulating pattern 230 may include an insulating material such as silicon oxide, silicon oxynitride, and/or silicon nitride.

The filling insulating pattern 230 may directly contact the inner surface of the vertical channel pattern 220. The lower part of the filling insulating pattern 230 may have the profile in which the width decreases closer to the substrate 100 similarly to the lower part 220_LP of the vertical channel pattern 220.

Figure 3A:
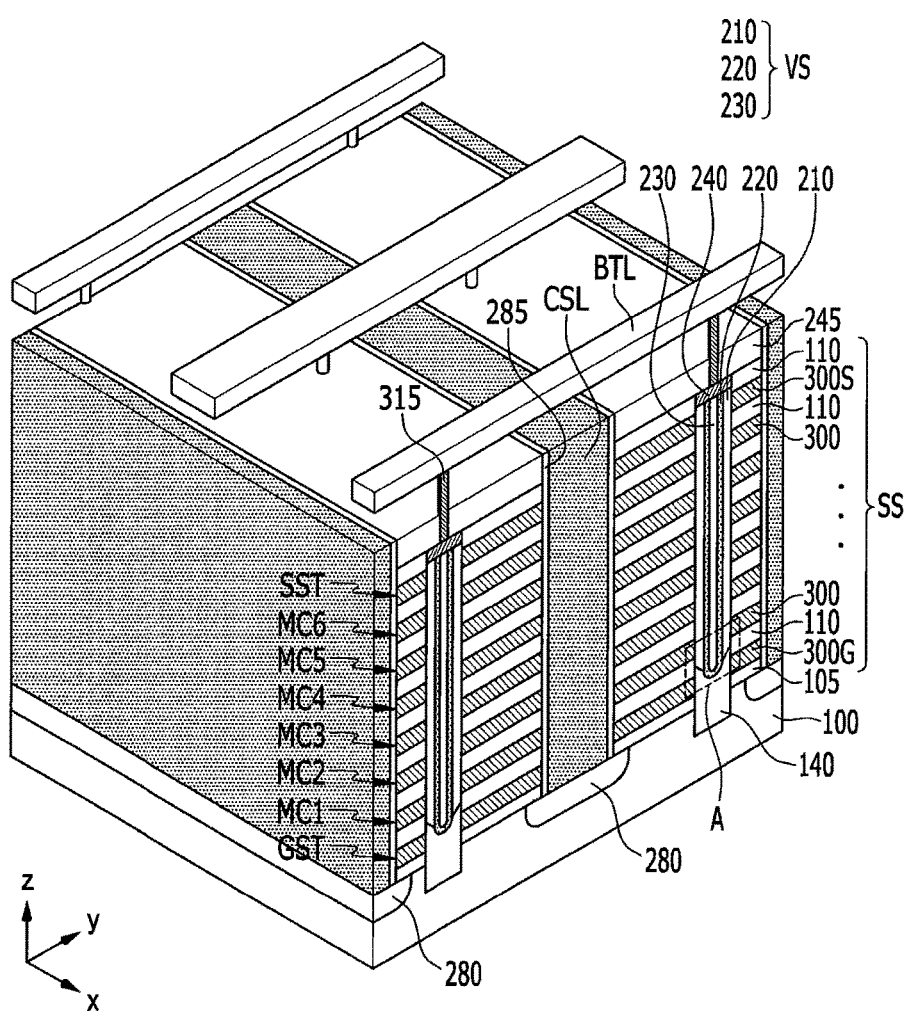
FIG. 3A is a perspective view illustrating a part of a semiconductor memory device according to another example embodiment of the present inventive concepts and FIG. 3B is an enlarged diagram of region A of FIG. 3A.
Figure 3B:
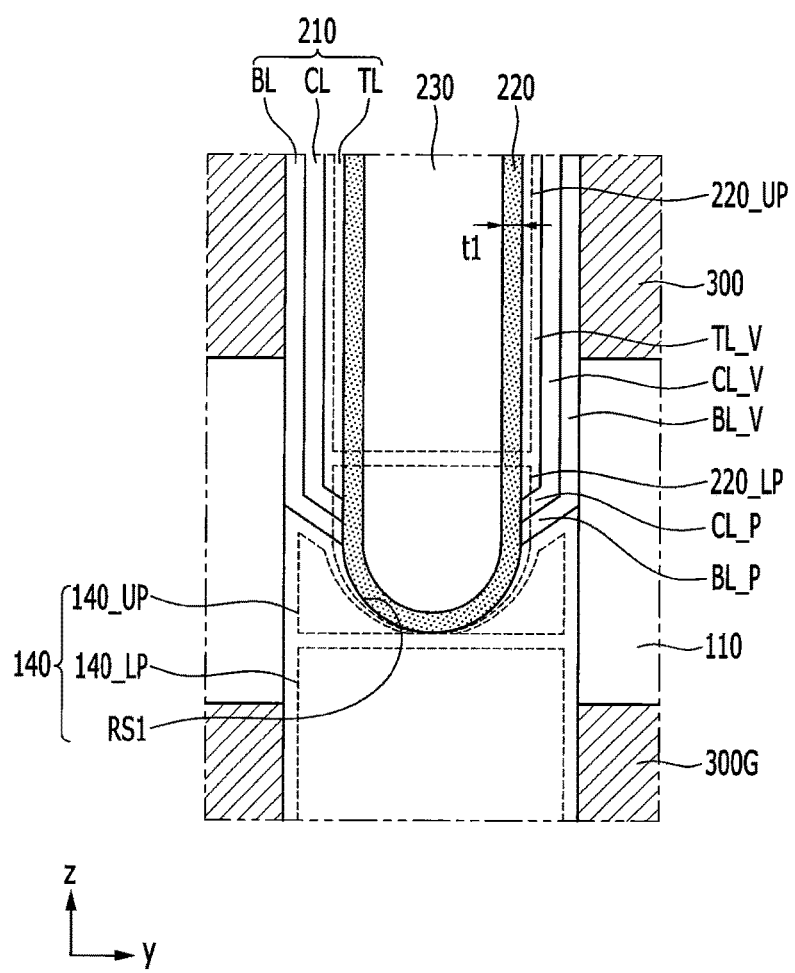

Hereinafter, a semiconductor memory device according to another example embodiment of the present inventive concepts will be described with reference to FIGS. 3A and 3B. FIG. 3A is a perspective view illustrating a part of a semiconductor memory device according to another example embodiment of the present inventive concepts and FIG. 3B is an enlarged diagram of region A of FIG. 3A. Detailed description of technical features that are duplicated with the technical features described with reference to FIGS. 1, 2A, and 2B herein will be omitted, and the description will primarily focus on differences between the example embodiments.

Referring to FIGS. 3A and 3B, the lower semiconductor pattern 140 may include a concave top in which the center is lower (e.g., closer to the substrate 100) than the edge and the first recess region RS1 may define the concave top. Therefore, an upper surface of the upper part 140_UP of the lower semiconductor pattern 140 may incline downwards from an outer edge of the upper part 140_UP (e.g. an edge farthest from the vertical channel pattern 220) towards the substrate 100. In the present inventive concepts, a shape in which the top of the lower semiconductor pattern 140 is convex up or concave down is illustrated, but is not limited thereto and a flat shape may also be provided.

The edge of the lower semiconductor pattern 140 may be positioned at a higher level than the bottom of the first recess region RS1. A distance from the edge of the upper part 140_UP of the lower semiconductor pattern 140 to the substrate 100 may be larger than the distance from the lowermost end of the first recess region RS1 to the substrate 100.

The blocking insulating layer BL may include a vertical part BL_V which extends in the z direction and a protrusion BL_P which extends toward the vertical channel pattern 220 from the bottom of the vertical part BL_V. The protrusion BL_P of the blocking insulating layer BL may directly contact the top of the upper part 140_UP of the lower semiconductor pattern 140. In some embodiments, the protrusion BLP may not contact the first recess region RS1. The protrusion BL_P of the blocking insulating layer BL may have a profile in which the protrusion BLP is inclined on the top of the upper part 140_UP of the lower semiconductor pattern 140. In more detail, the protrusion BL_P may have a profile in which the protrusion BLP is inclined toward the substrate 100 in a direction toward the vertical channel pattern 220 from a part connected with the vertical part BL_V.

The charge storing layer CL may include a vertical part CL_V which extends in the z direction and a protrusion CL_P which extends toward the vertical channel pattern 220 from the bottom of the vertical part CL_V. In detail, the protrusion CL_P may have a profile in which the protrusion CL_P is inclined toward the substrate 100 in a direction toward the vertical channel pattern 220 from a part connected with the vertical part CL_V.

The bottom of the vertical part TL_V of the tunnel insulating layer TL may directly contact the top of the protrusion CL_P of the charge storing layer CL. The bottom of the vertical part TL_V of the tunnel insulating layer TL may have a profile in which the bottom is inclined like the top of the protrusion CL_P of the charge storing layer CL.

The bottom of the lower part 220_LP of the vertical channel pattern 220 may be positioned at a lower level than the edge of the lower semiconductor pattern 140 farthest from the substrate 100 and may be positioned at a higher level than the top of the gate electrode 300G positioned at the lowermost end of the plurality of gate electrodes 300. In other words, the distance from the lowermost end of the lower part 220_LP of the vertical channel pattern 220 to the substrate 100 may be smaller than the distance from the upper edge of the lower semiconductor pattern 140 to the substrate 100 and larger than the distance from the top of the gate electrode 300G positioned at the lowermost end to the substrate 100.

In some embodiments, as illustrated in FIGS. 3A and 3B, the gate insulating layer GI may be omitted from between the between the lower semiconductor pattern 140 and the gate electrode 300G positioned at the lowermost end of the plurality of gate electrodes 300.

Figure 4A:
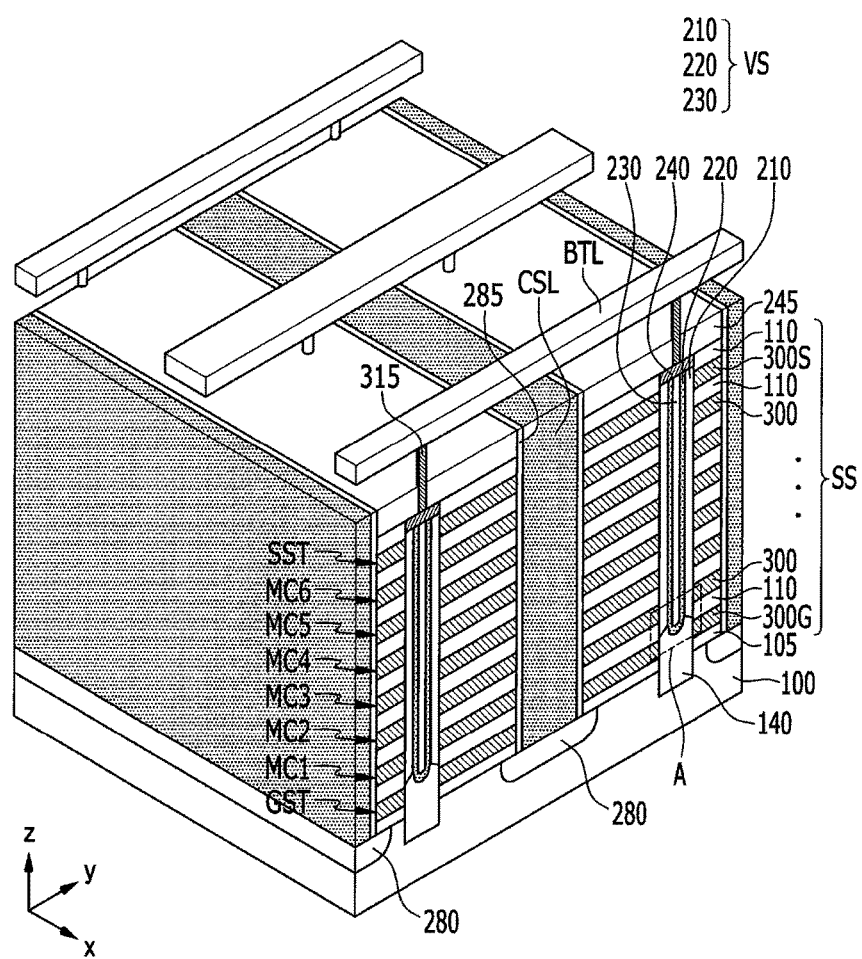
FIG. 4A is a perspective view illustrating a part of a semiconductor memory device according to another example embodiment of the present inventive concepts and FIG. 4B is an enlarged diagram of region A of FIG. 4A.
Figure 4B:
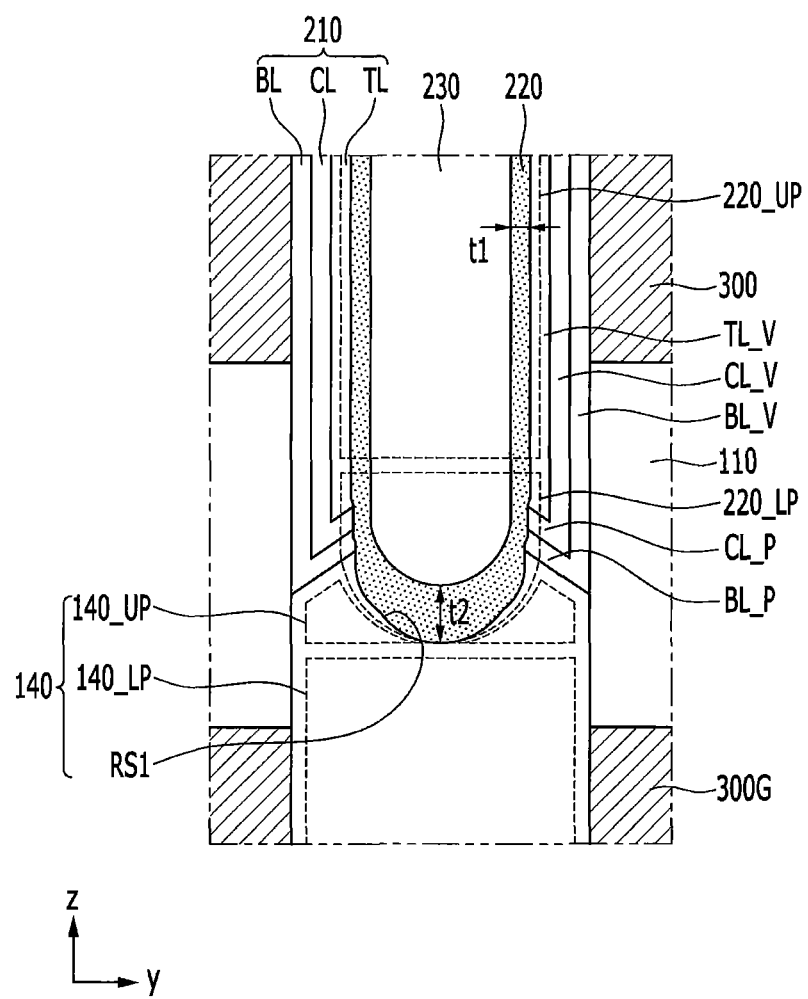

Hereinafter, a semiconductor memory device according to another example embodiment of the present inventive concepts will be described with reference to FIGS. 4A and 4B. FIG. 4A is a perspective view illustrating a part of a semiconductor memory device according to another example embodiment of the present inventive concepts and FIG. 4B is an enlarged diagram of region A of FIG. 4A. Detailed description of technical features that are duplicated with technical features described with reference to FIGS. 1, 2A, and 2B as above will be omitted, and the description will primarily focus on differences between the example embodiments.

Referring to FIGS. 4A and 4B, the lower semiconductor pattern 140 may include the first recess region RS1 penetrating the upper part 140_UP. The yz-direction cross section of the first recess region RS1 may have a profile having a shape including an uneven surface. The first recess region RS1 may substantially have a profile in which the width decreases toward the substrate 100.

The outer surface of the lower part 220_LP of the vertical channel pattern 220 may include an irregularly uneven surface. In detail, a lateral surface of the protrusion BLP of the blocking insulating layer BL directly contacting the outer surface of the lower part 220_LP of the vertical channel pattern 220, the lateral surface of the protrusion CL_P of the charge storing layer CL, and the inner surface of the vertical part TL_V of the tunnel insulating layer TL may not form a coplanar surface, but form an uneven surface.

In the vertical channel pattern 220 connected with the lower semiconductor pattern 140, the first thickness t1 of the yz-direction cross section of the upper part 220_UP of the vertical channel pattern 220 and a second thickness t2 of the yz-direction cross section of the lower part 220_LP may be different from each other. In detail, the second thickness t2 may be larger than the first thickness t1.

A lower surface of the filling insulating pattern 230 may have an uneven shape. The lower surface of the filling insulating pattern 230 may be formed on the surface of the vertical channel pattern 220 while directly contacting the surface of the vertical channel pattern 220.

Hereinafter, manufacturing methods of semiconductor memory devices according to example embodiments of the present inventive concepts will be described with reference to FIGS. 5 to 20. FIGS. 5, 6, 7, 8, 9A, 10A, 11A, 12A, 13A, 14A, 15, 16, 17, 18, 19, and 20 are cross-sectional views for describing the manufacturing methods of the 3D semiconductor memory devices according to example embodiments of the present inventive concepts and each of FIGS. 9B, 10B, 11B, 12B, 13B, and 14B are enlarged diagrams of region A of the corresponding figures according to the manufacturing methods.

Figure 5:
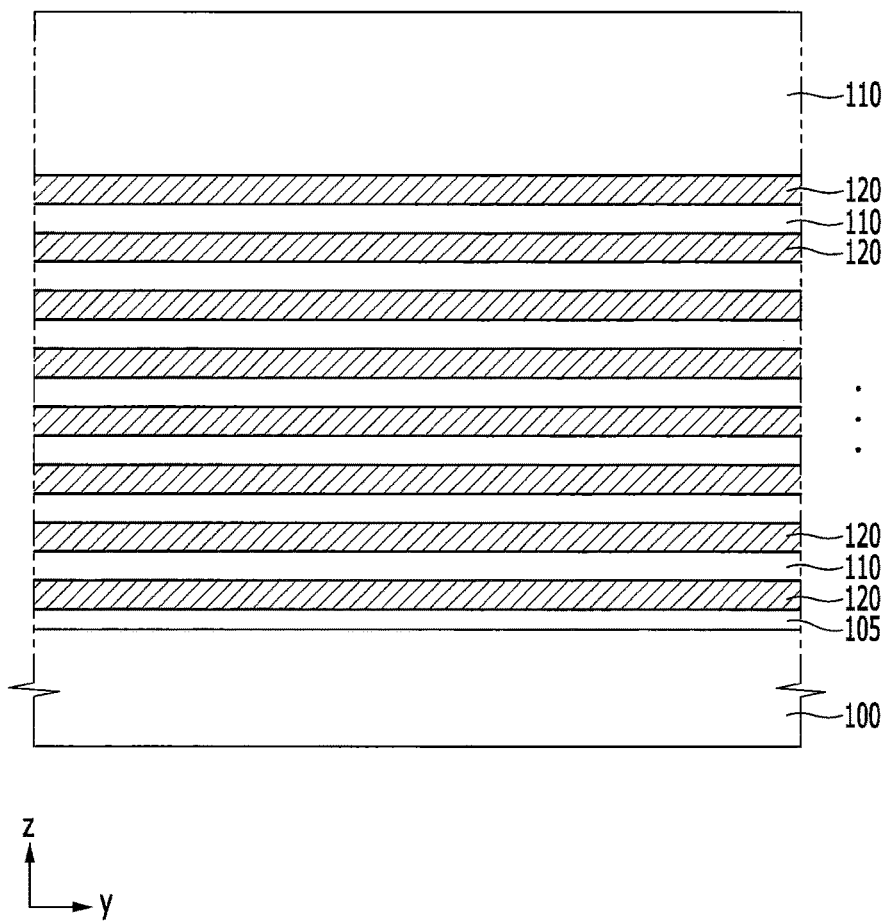
FIGS. 5, 6, 7, 8, 9A, 10A, 11A, 12A, 13A, 14A, 15, 16, 17, 18, 19, and 20 are cross-sectional views for describing methods for manufacturing semiconductor memory devices according to example embodiments of the present inventive concepts

Referring to FIG. 5, the plurality of insulating layers 110 and a plurality of sacrificial layers 120 are stacked on the substrate 100 alternately in the z direction.

The plurality of sacrificial layers 120 may have substantially the same thickness. However, the present inventive concepts are not limited thereto, and the sacrificial layers 120 of a lowermost part and an uppermost part of the stacked plurality of sacrificial layers 120 may be formed to be thicker than other sacrificial layers 120 positioned therebetween. In some embodiments, the plurality of insulating layers 110 may have substantially the same thickness, but in some embodiments the insulating layer 110 positioned in the lowermost part and the uppermost part of the stacked plurality of the insulating layers 110 may have different thicknesses than other insulating layers 110 positioned therebetween.

The plurality of sacrificial layers 120 may include a silicon nitride layer, a silicon oxynitride layer, and/or a silicon layer and the plurality of insulating layers 110 may include a silicon oxide layer. The plurality of sacrificial layers 120 and the plurality of insulating layers 110 may be deposited by using a thermal CVD, plasma enhanced CVD, physical CVD, or atomic layer deposition (ALD) process, though the present inventive concepts are not limited thereto.

In addition, the lower insulating layer 105 may be formed between the substrate 100 and the sacrificial layer 120 positioned at the lowermost end. The lower insulating layer 105 may be made of a material having a higher selection ratio than the plurality of sacrificial layers 120 and the plurality of insulating layers 110. As one example, the lower insulating layer 105 may include a high dielectric layer such as a silicon nitride layer, an aluminum oxide layer, and/or a hafnium oxide layer. The lower insulating layer 105 may be formed to have a smaller thickness than the plurality of sacrificial layers 120 and the plurality of insulating layers 110.

Figure 6:
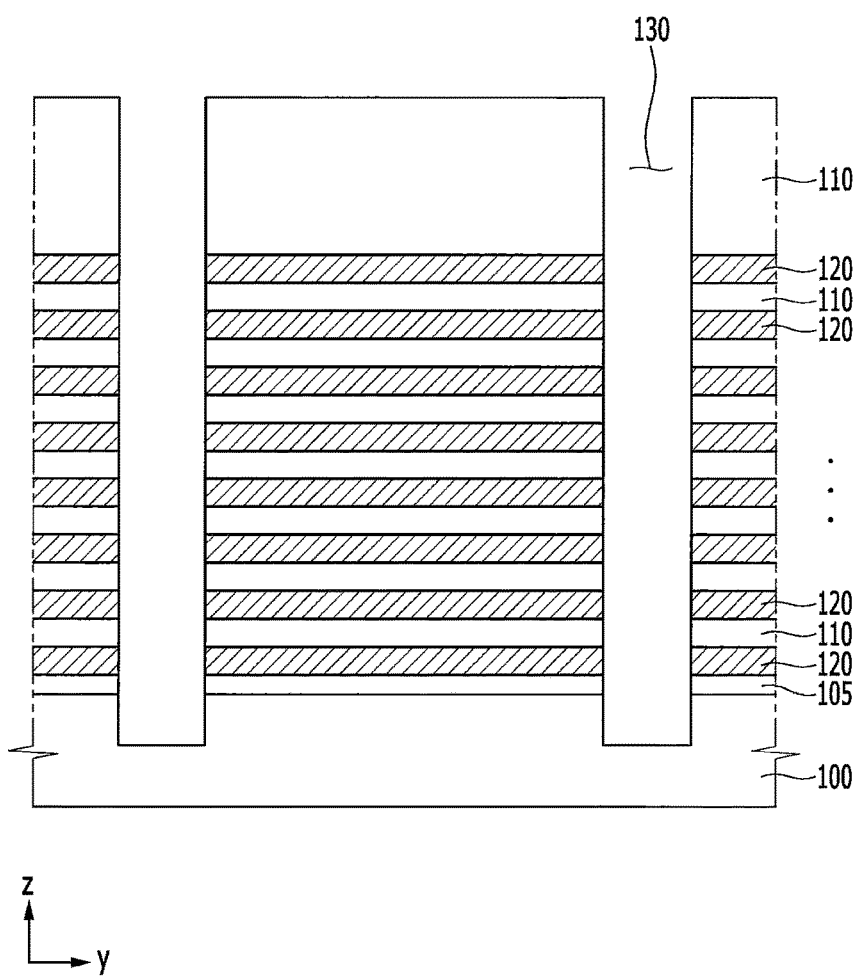

Referring to FIG. 6, a channel hole 130 may be formed, which exposes the substrate 100 by penetrating the plurality of insulating layers 110 and the plurality of sacrificial layers 120 in a direction (e.g., the z direction) perpendicular to the substrate 100. In some embodiments, forming the channel hole 130 may include forming a mask pattern (not illustrated) on the insulating layer 110 positioned in the uppermost part and anisotropically etching the insulating layers 110, the sacrificial layers 120, and the lower insulating layer 105 until the top of the substrate 100 is exposed by using the mask pattern (not illustrated) as an etching mask. In an anisotropic etching process, the top of the substrate 100 in the channel hole 130 may be recessed with a predetermined depth by overetching. Thereafter, the mask pattern may be removed.

As illustrated in FIG. 6, the channel hole 130 may be formed to have a uniform width according to a height from the substrate 100 by the anisotropic etching, but the present inventive concepts are not limited thereto, and the channel hole 130 may be formed to have a different width according to the height from the substrate 100. That is, the channel hole 130 may have a side wall inclined to the substrate 100. The channel hole 130 may have a circular shape, oval shape, or polygonal shape from the viewpoint of a plane parallel to the substrate (e.g., an x-y plane).

Figure 7:
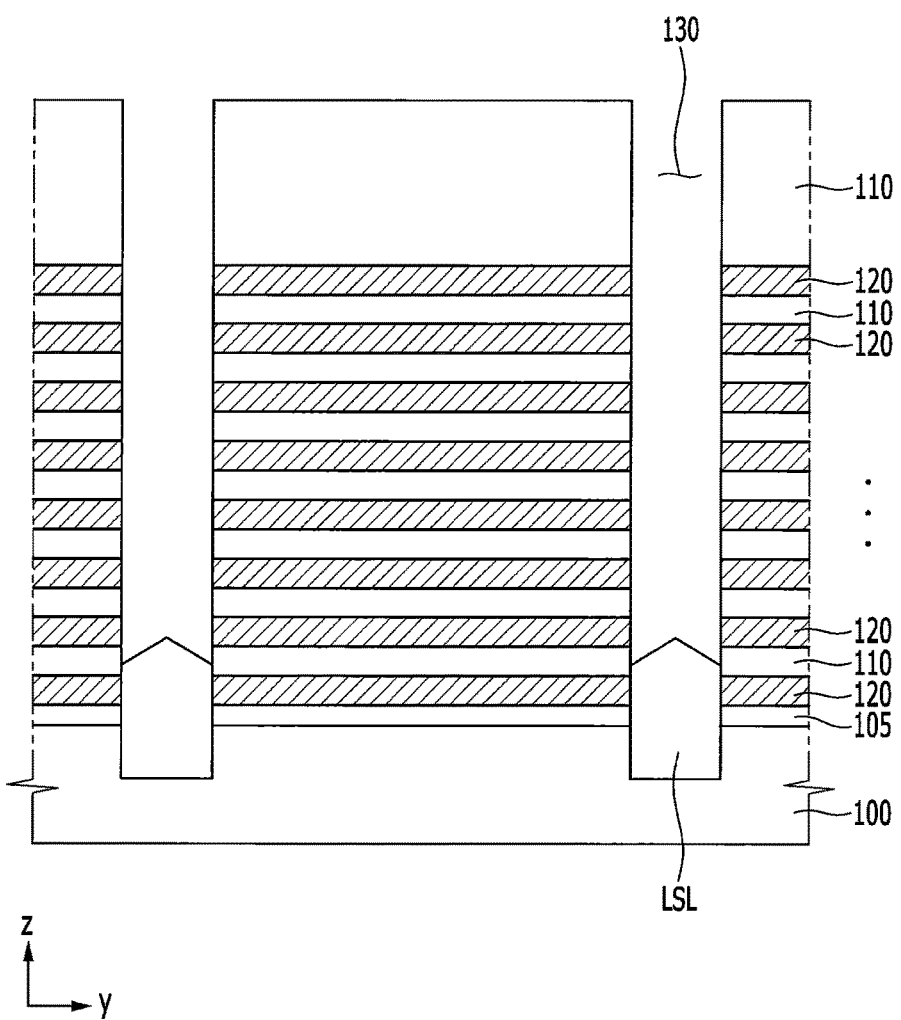

Next, as illustrated in FIG. 7, a lower semiconductor layer LSL within and/or filling the recessed region may be formed. The lower semiconductor layer LSL may be formed by performing a selective epitaxial growth (SEG) process using the substrate 100 exposed by the channel hole 130 as a seed. The lower semiconductor layer LSL may be integrated with the substrate 100.

The lower semiconductor layer LSL may be formed in a pillar shape in which the lower semiconductor layer LSL protrudes from the top of the substrate 100 in the z direction to fill a lower region of the channel hole 130. The lower semiconductor layer LSL may cover the side wall of the sacrificial layer 120 in the lowermost part of the plurality of sacrificial layers 120. The top of the lower semiconductor layer LSL may be positioned at a level between the bottom and the top of the insulating layer 110 on the lowermost sacrificial layer 120 of the plurality of sacrificial layers 120. The distance from the uppermost part of the lower semiconductor layer LSL to the substrate 100 may be larger than the distance from the top of the sacrificial layer 120 positioned at the lowermost end to the substrate 100.

As a result of performing the selective epitaxial growth process, each lower semiconductor layer LSL may have the top which is convex up. In detail, the width of the upper part of the lower semiconductor layer LSL may decrease in the z direction away from the substrate 100.

The lower semiconductor layer LSL may include the same conductive semiconductor material as the substrate 100. In the selective epitaxial growth process, the lower semiconductor layer LSL may be doped with the impurities in-situ. The lower semiconductor layer LSL may include a single-crystal structure and/or polycrystalline structure semiconductor material and, in some embodiments, the lower semiconductor layer LSL may include silicon.

Figure 8:
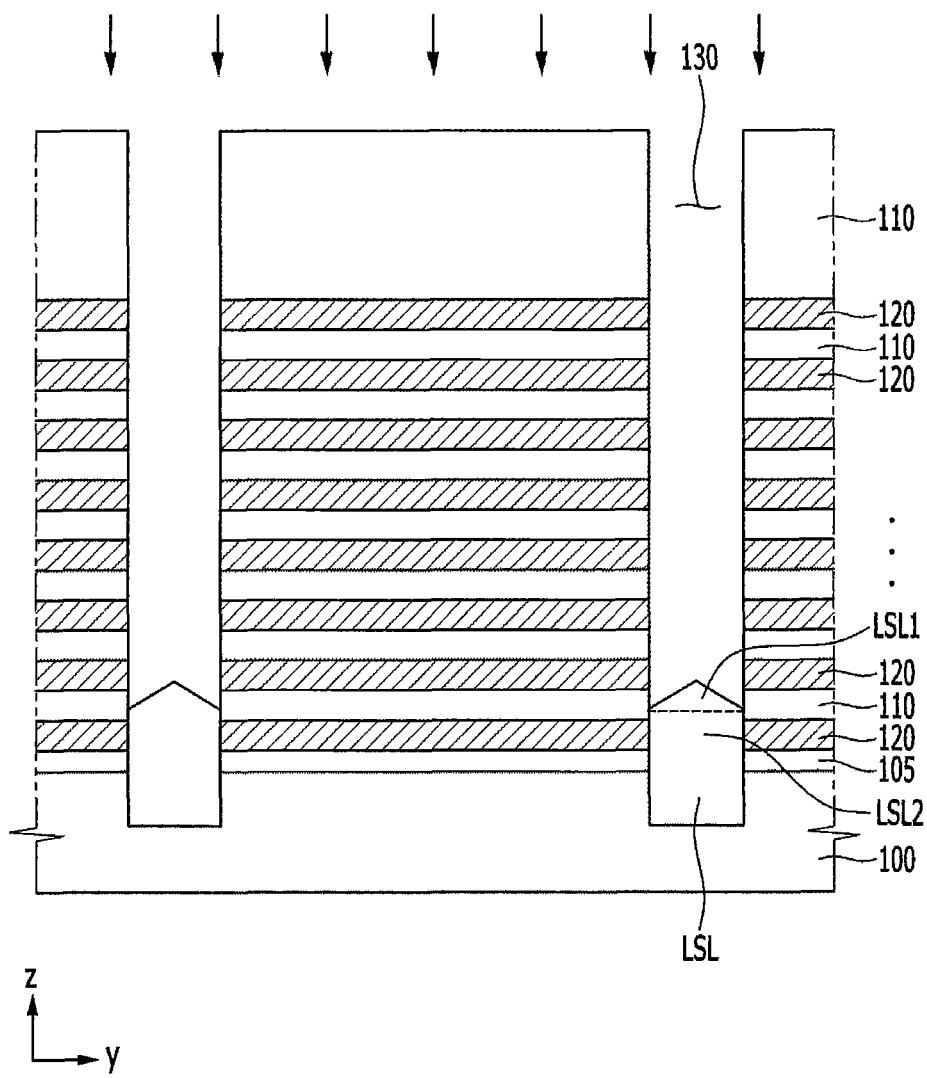

Next, as illustrated in FIG. 8, after the selective epitaxial growth process, an ion injection process may be performed with respect to a top surface of the substrate 100 including the lower semiconductor layer LSL. The lower semiconductor layer LSL may include a first region LSL1 including a first impurity through the ion injection process. The first impurity may be at least one of C, N, O, Cl, F, B, Ph, and As. Among them, C, N, O, and Cl may be more appropriate. The first region LSL1 may be formed in the upper part of the lower semiconductor layer LSL. In detail, the first region LSL1 may be formed at a higher level than the top of the sacrificial layer 120 positioned at the lowermost end.

Meanwhile, the lower semiconductor layer LSL may be doped with the impurities in the selective epitaxial growth process. In some embodiments, the doped impurities may be a second impurity and a second region LSL2 including a second impurity may be formed. The second impurity may be the same conductive impurity as the substrate 100.

When the first impurity is injected through the ion injection process, the first impurity may form a profile in which the first impurity is continuous or discontinuous in the lower semiconductor layer LSL and among them, the first region LSL1 may include a region in which the first impurity is distributed most. Similarly thereto, the second region LSL2 may include a region in which the second impurity is distributed most among regions doped with the second impurity.

The first region LSL1 may be positioned in the upper part of the lower semiconductor layer LSL and the second region LSL2 may be positioned in the lower part of the lower semiconductor layer LSL, and the level of the first region LSL1 may be higher than the level of the second region LSL2. In other words, the distance from the first region LSL1 to the substrate 100 may be larger than the distance from the second region LSL2 to the substrate 100.

Further, the first region LSL1 may be formed to be positioned at a higher level than the top of the sacrificial layer 120 positioned at the lowermost end, and the second region LSL2 may be formed to be positioned at substantially the same level as the sacrificial layer 120 positioned at the lowermost end. That is, the distance from the first region LSL1 to the substrate 100 may be larger than the distance from the top of the sacrificial layer 120 positioned at the lowermost end to the substrate 100 and the second region LSL2 may overlap with the sacrificial layer 120 positioned at the lowermost end in the y direction.

Meanwhile, the ion injection process is performed with respect to the top surface of the substrate 100, and as a result, the first impurity may be injected into the insulating layer 110 positioned at the uppermost end as well as the lower semiconductor layer LSL. Accordingly, the insulating layer 110 positioned at the uppermost end may include the first impurity.

Figure 9A:
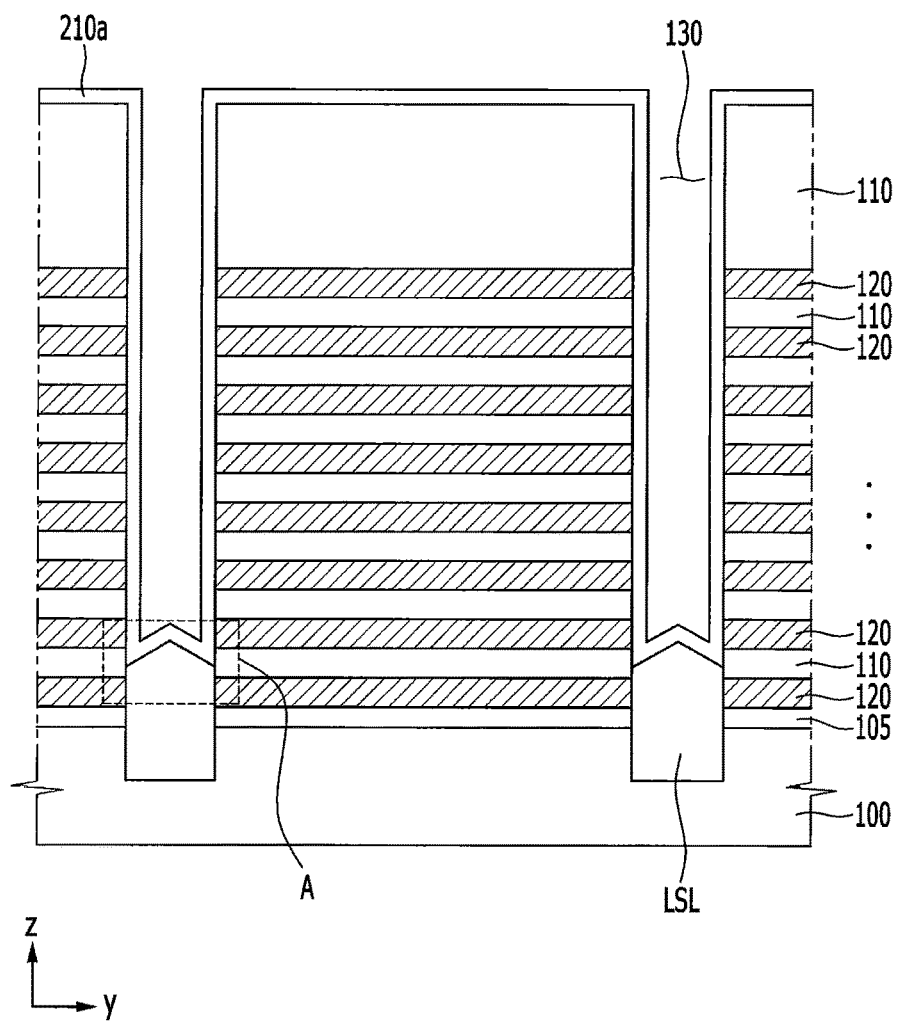

Referring to FIG. 9A, a vertical insulating layer 210a may be formed, which is on the inner wall of the channel hole 130 and is on the top of the lower semiconductor layer LSL. The channel hole 130 may not be completely filled by the vertical insulating layer 210a. The lower part of the vertical insulating layer 210a may have a profile in which the lower part is inclined on the top of the lower semiconductor layer LSL. In detail, the lower part of the vertical insulating layer 210a may have a shape in which the lower part is inclined away from the substrate 100 toward the center of the lower semiconductor layer LSL.

Figure 9B:
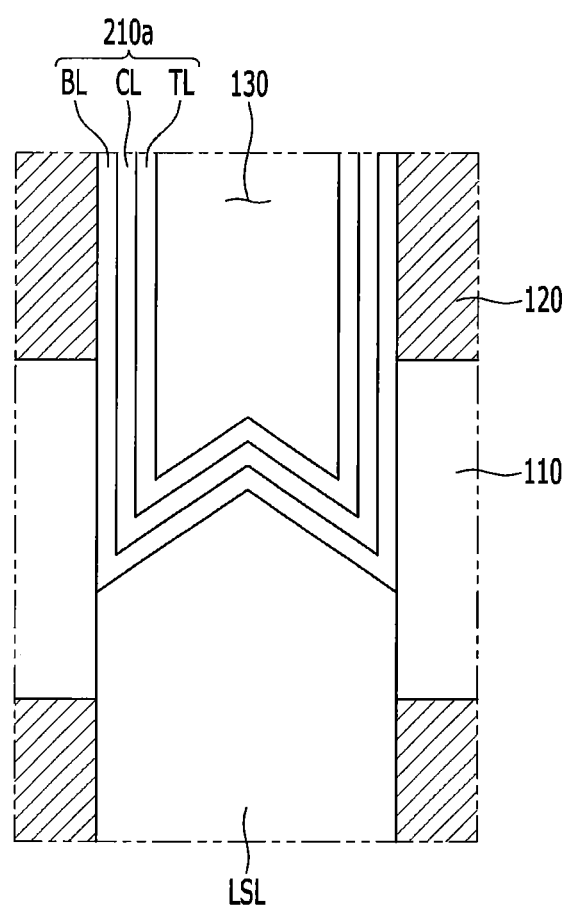
FIGS. 9B, 10B, 11B, 12B, 13B, and 14B are enlarged diagrams of region A of the corresponding figures according to the manufacturing methods.

Forming the vertical insulating layer 210a may include sequentially conformally forming the blocking insulating layer BL, the charge storing layer CL, and the tunnel insulating layer TL on the inner wall of the channel hole 130 as illustrated in FIG. 9B. In some embodiments, the blocking insulating layer BL may include a silicon oxide layer, a silicon oxynitride layer, an aluminum oxide layer, and/or a hafnium oxide layer. The charge storing layer CL may include at least one of a silicon nitride layer, a silicon oxynitride layer, a silicon (Si)-rich nitride layer, a nanocrystalline silicon (Si), and/or a laminated trap layer. The tunnel insulating layer TL may include a silicon oxide layer. Each of the blocking insulating layer BL, the charge storing layer CL, and the tunnel insulating layer TL may be deposited by using the plasma enhanced CVD, physical CVD, or atomic layer deposition (ALD) process, though the present inventive concepts are not limited thereto.

Figure 10A:
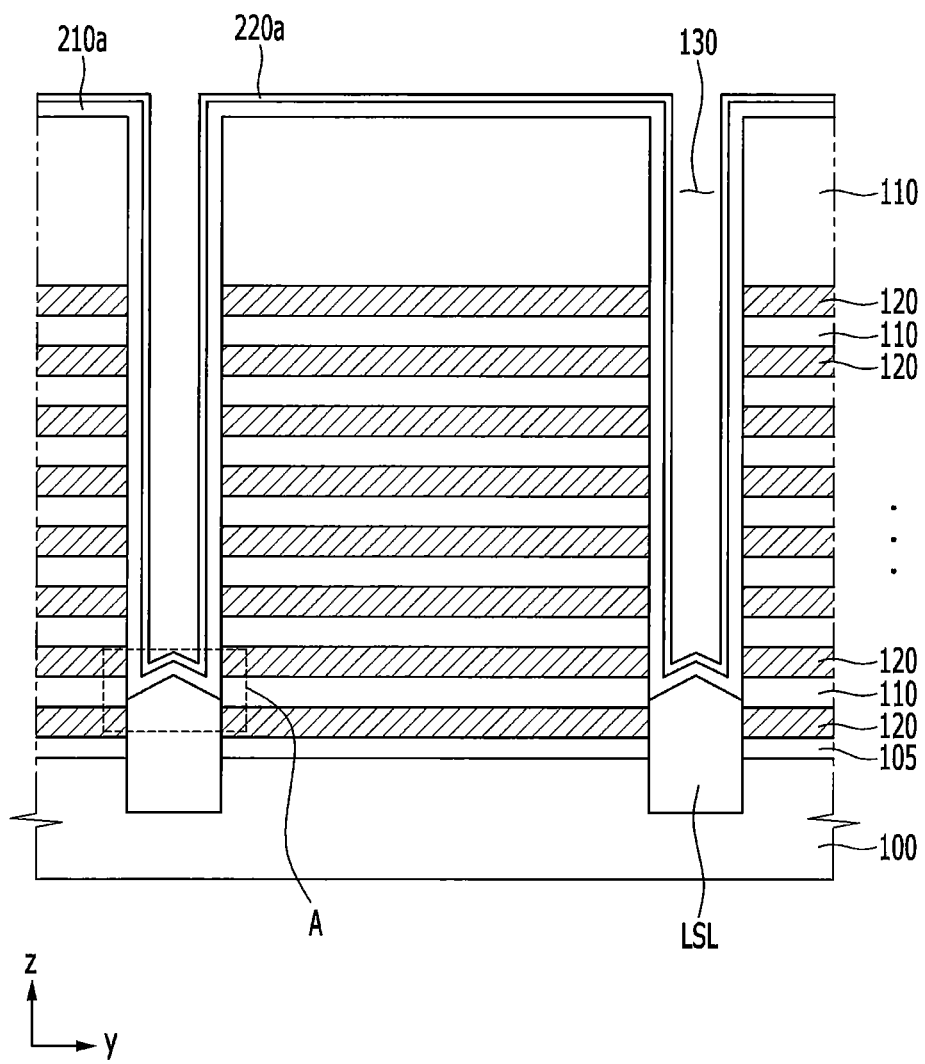
Figure 10B:
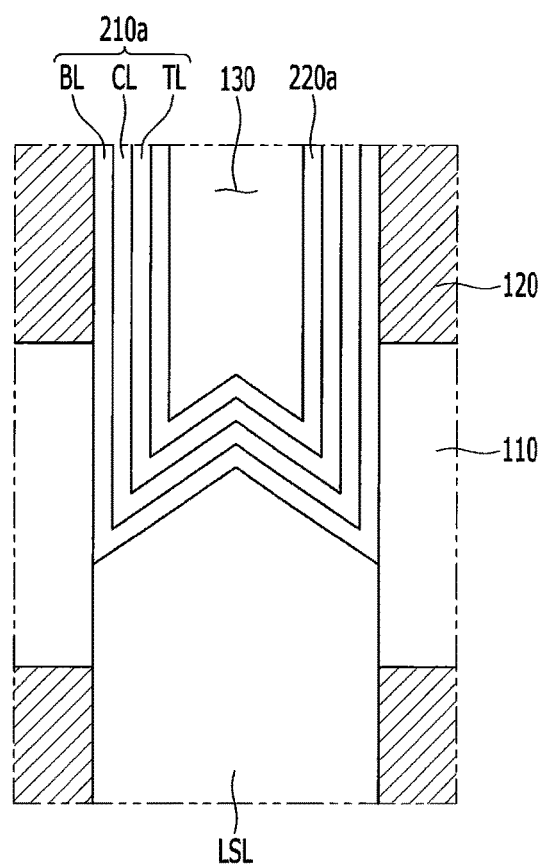

Referring to FIGS. 10A and 10B, a sacrificial channel layer 220a may be formed in the channel hole 130. The sacrificial channel layer 220a may be formed on the vertical insulating layer 210a. The sacrificial channel layer 220a may include a single crystal silicon, a polycrystalline silicon, and/or an amorphous silicon. The sacrificial channel layer 220a may be formed by using the atomic layer deposition (ALD) or chemical vapor deposition (CVD), though the present inventive concepts are not limited thereto.

The sacrificial channel layer 220a may be formed to cover the inner surface of the vertical insulating layer 210a. In some embodiments, the channel hole 130 may not be completely filled by the sacrificial channel layer 220a. The lower part of the sacrificial channel layer 220a may have a profile in which the lower part is inclined away from the substrate 100 toward the center of the lower semiconductor layer LSL along the lower part of the vertical insulating layer 210a.

Figure 11A:
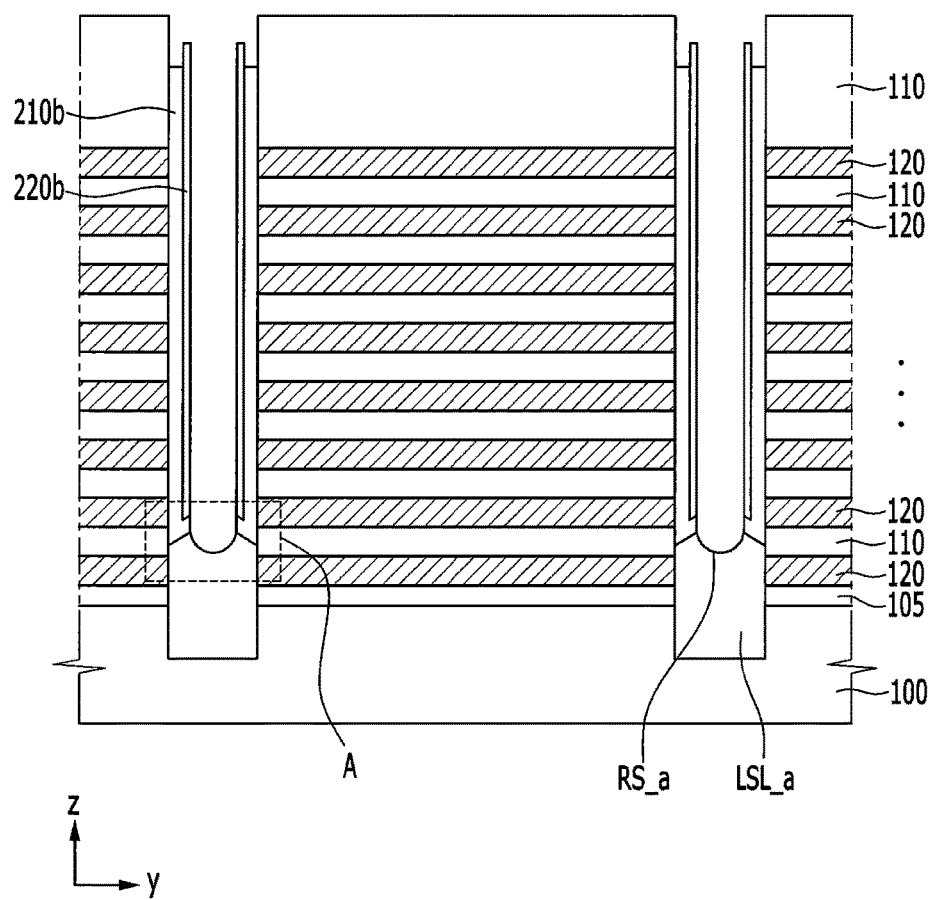

Next, a vertical insulating intermediate pattern 210b and a sacrificial channel pattern 220b may be formed in the channel hole 130 by anisotropically etching the sacrificial channel layer 220a and the vertical insulating layer 210a as illustrated in FIG. 11A. Each of the vertical insulating intermediate pattern 210b and the sacrificial channel pattern 220b may have a pipe shape in which the top and the bottom are opened. The vertical insulating intermediate pattern 210b and the sacrificial channel pattern 220b may expose a part of a lower semiconductor intermediate pattern LSL_a formed by partially etching the lower semiconductor layer LSL.

Figure 11B:
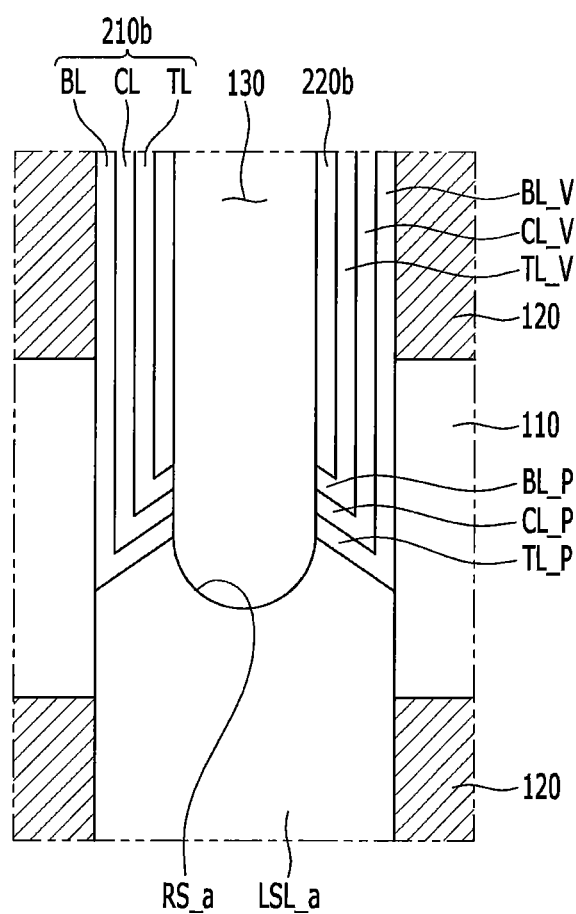

In detail, referring to FIG. 11B, the vertical insulating intermediate pattern 210b may be formed to include the blocking insulating layer BL including the vertical part BL_V and the protrusion BLP which extends from the vertical part BL_V toward the channel hole 130, the charge storing layer CL including the vertical part CL_V and the protrusion CL_P which extends from the vertical part CL_V toward the channel hole 130, and the tunnel insulating layer TL including the vertical part TL_V and the protrusion TL_P which extends from the vertical part TL_V toward the channel hole 130. In some embodiments, the inner surfaces of the protrusions BL_P, CL_P, and TL_P included in the blocking insulating layer BL, the charge storing layer CL, and the tunnel insulating layer TL, respectively are etched through the same process, and as a result, the inner surfaces may form the same (e.g. coplanar) surface.

The sacrificial channel pattern 220b may be removed in such a manner that the bottom which overlaps with the top of the lower semiconductor layer LSL which protrudes is removed. The sacrificial channel pattern 220b may be formed by removing the sacrificial channel layer 220a which overlaps with the bottom of the channel hole 130. The sacrificial channel pattern 220b may directly contact the vertical part TL_V of the tunnel insulating layer TL and may not contact the blocking insulating layer BL and the charge storing layer CL.

Further, as a result of the overetching while anisotropically etching the sacrificial channel layer 220a and the vertical insulating layer 210a, the lower semiconductor intermediate pattern LSL_a may include an intermediate recess region RS_a which is recessed concavely toward the substrate 100. The level of the lowermost end of the intermediate recess region RS_a may be formed to be higher than the level of the top of the sacrificial layer 120 positioned at the lowermost end of the plurality of sacrificial layers 120.

Figure 12A:
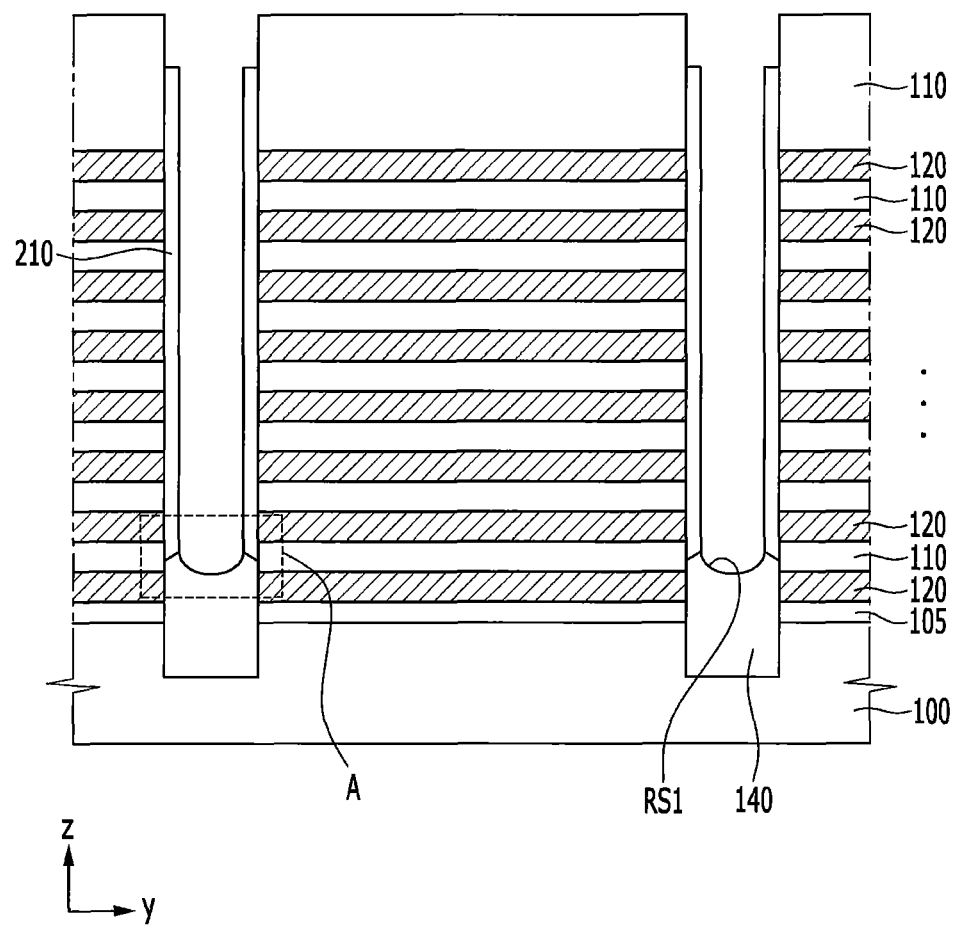

Next, as illustrated in FIG. 12A, the sacrificial channel pattern 220b may be completely removed and the lower semiconductor intermediate pattern LSL_a which overlaps with the sacrificial channel pattern 220b may be partially etched to form the lower semiconductor pattern 140 including the first recess region RS1.

As a solution that etches the sacrificial channel pattern 220b, alkaline solutions such as, for example, an ammonia solution, potassium hydroxide, or tetramethylammonium hydroxide (TMAH) may be used and/or an etching atmosphere may adopt gas such as, for example, $NF_3$, $Cl_2$, and HBr.

In the course of etching the sacrificial channel pattern 220b, the lower semiconductor intermediate pattern LSL_a may be overetched by the etching solution and/or patterned in a predetermined shape. However, the lower semiconductor pattern 140 according to example embodiments of the present inventive concepts may include the first region LSL1 doped with the first impurity, and the first impurity included in the first region LSL1 may have resistance to the etching solution to prevent the lower semiconductor pattern 140 from being overetched. The first region LSL1 may serve as an etching stopper, and as a result, the lower semiconductor pattern 140 may be prevented or inhibited from being recessed to the first region LSL1 or lower. The first region LSL1 included in the lower semiconductor pattern 140 may be exposed by the etching.

Figure 12B:
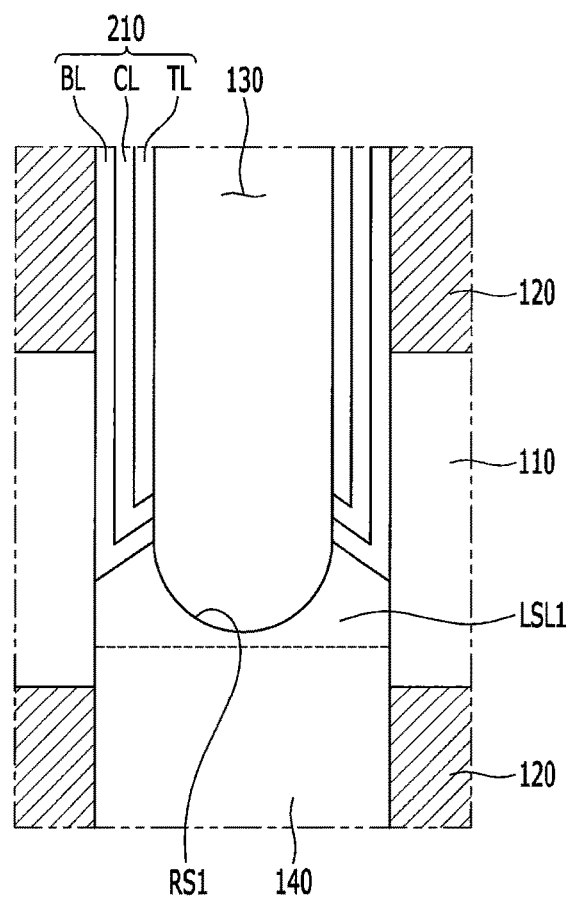

As illustrated in FIG. 12B, the edge of the first recess region RS1 may substantially match the edge of the outer surface of the sacrificial channel pattern (see 220b of FIG. 11B) which is removed.

Further, a part of the protrusion BL_P of the blocking insulating layer BL which overlaps with the sacrificial channel pattern (see 220b of FIG. 11B), a part of the protrusion CL_P of the charge storing layer CL, and the entirety of the protrusion TL_P (see FIG. 11B) of the tunnel insulating layer TL are etched at the time of removing the sacrificial channel pattern (see 220b of FIG. 11B), and as a result, the blocking insulating layer BL, the charge storing layer CL, and the tunnel insulating layer TL illustrated in FIG. 12B may be formed. The inner surfaces of the protrusions BL_P and CL_P included in the blocking insulating layer BL and the charge storing layer CL, respectively, and the inner surface of the vertical part TL_V of the tunnel insulating layer TL may be configured to form the same (e.g., coplanar) surface.

Figure 13A:
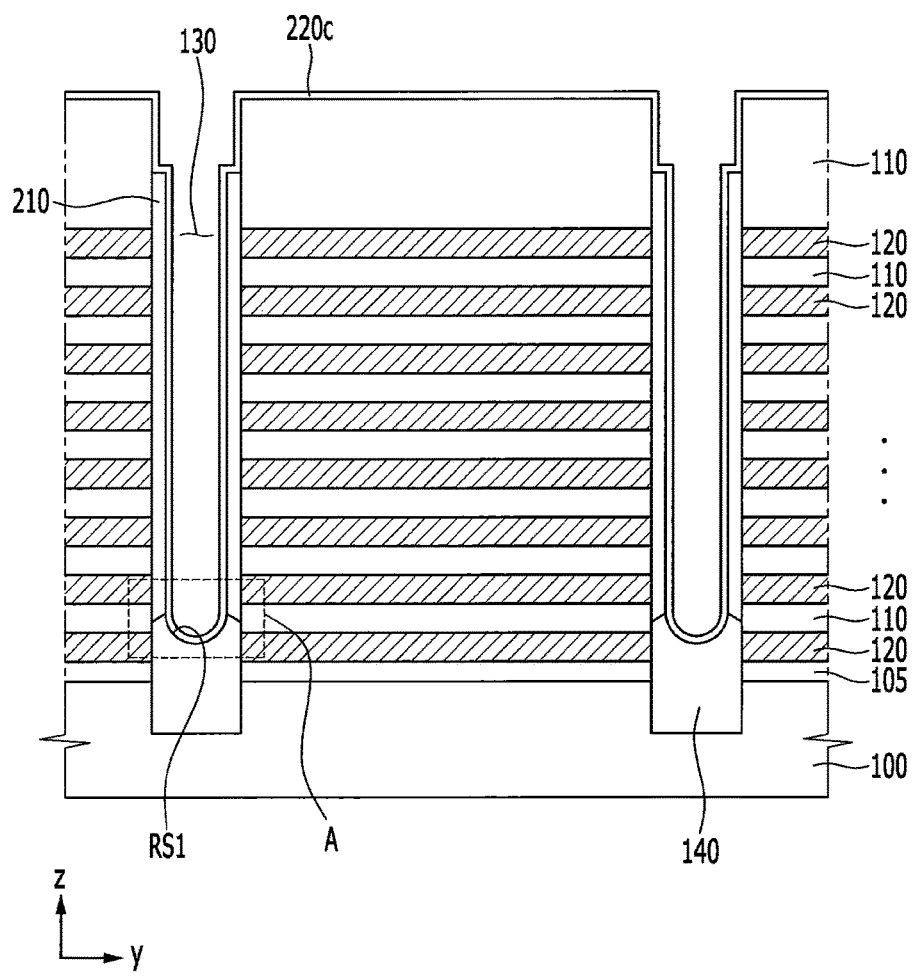
Figure 13B:
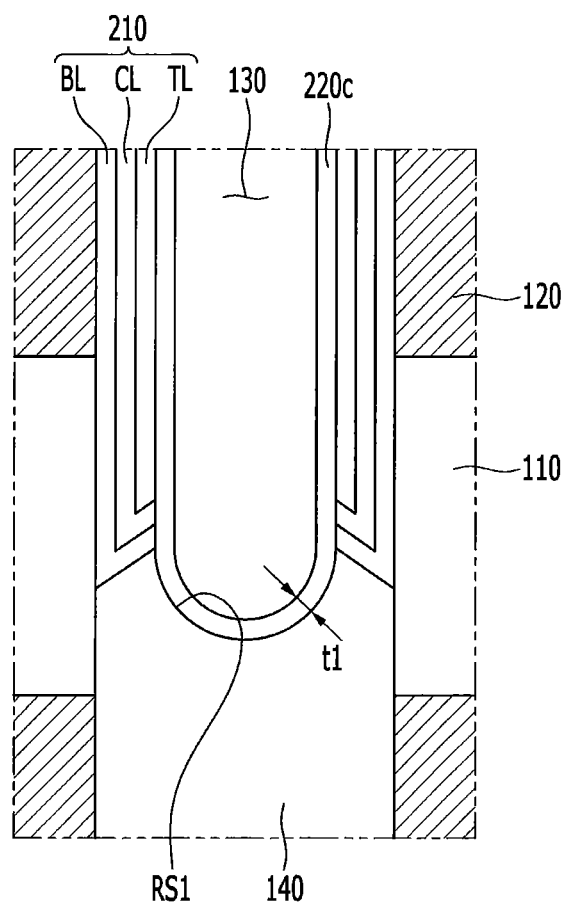

Next, as illustrated in FIGS. 13A and 13B, a vertical channel layer 220c may be formed in the channel hole 130. The vertical channel layer 220c may be formed with a thickness so as not to completely fill the channel hole 130, that is, a predetermined thickness in the channel hole 130.

The vertical channel layer 220c may include a semiconductor material having the polycrystalline structure or single crystal structure. In some embodiments, the vertical channel layer 220c may include a polycrystalline silicon layer, a single-crystal silicon layer, and/or an amorphous silicon layer. The vertical channel layer 220c may be formed by using the atomic layer deposition (ALD) or chemical vapor deposition (CVD), though the present inventive concepts are not limited thereto.

The thickness of the vertical channel layer 220c may decrease by performing a cleaning process on the vertical channel layer 220c. The cleaning process may be, as one example, a standard clean (SC)-1 process. In the cleaning process, a mixed cleaning solution of ammonium hydroxide and hydrogen peroxide may be used. During the cleaning process, a part of the vertical channel layer 220c which is exposed may be oxidized and, subsequently, the part of the vertical channel layer 220c which is oxidized may be removed. Accordingly, as a result of the cleaning process, the vertical channel layer 220c may be formed to have the first thickness t1.

Figure 14A:
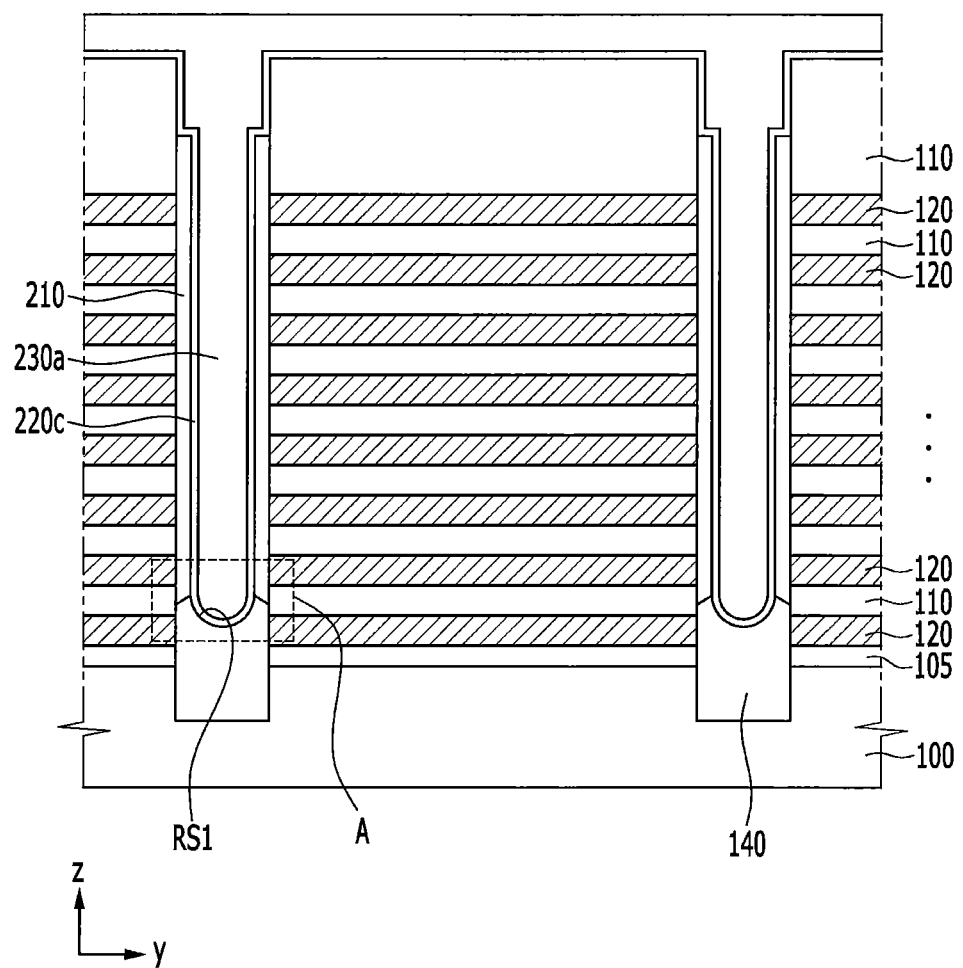
Figure 14B:
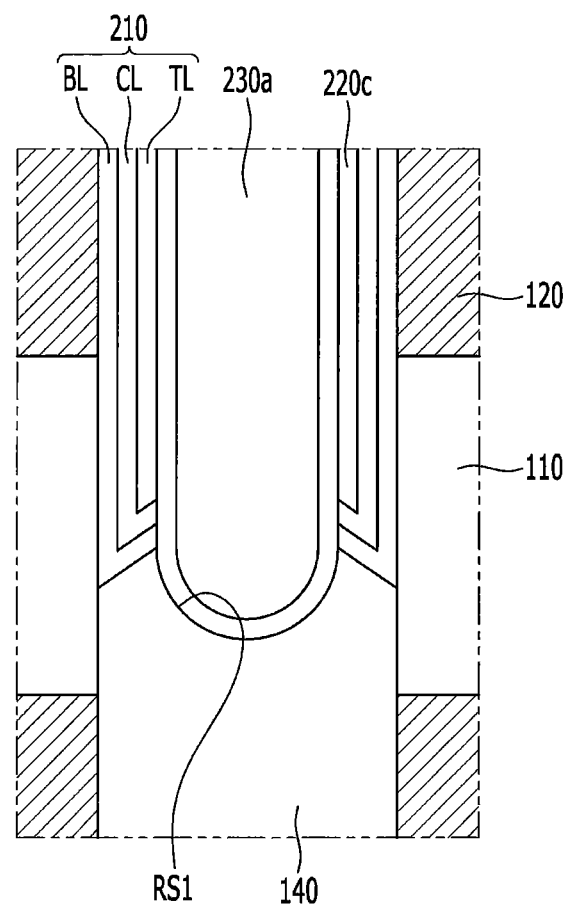

Subsequently, as illustrated in FIGS. 14A and 14B, a filling insulating layer 230a may be formed to be within and, in some embodiments, completely fill, the inside of the channel hole 130. The filling insulating layer 230a may be a silicon oxide layer formed by using an SOG technology.

Figure 15:
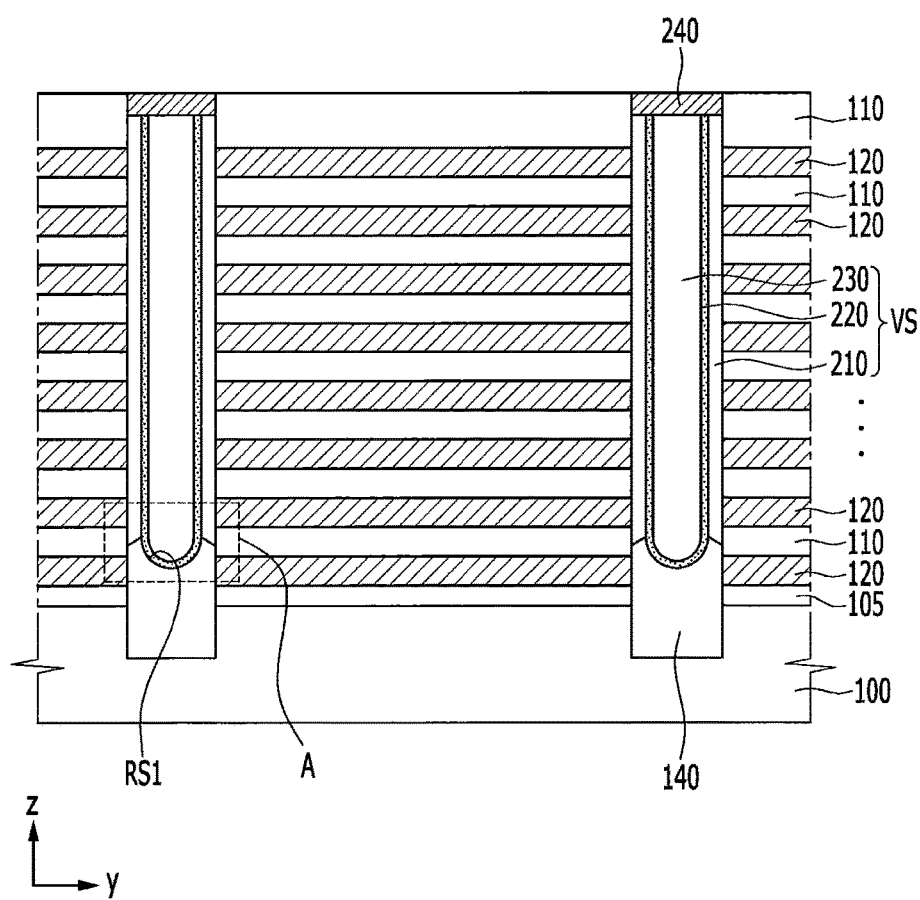

Thereafter, as illustrated in FIG. 15, the filling insulating pattern 230 and the vertical channel pattern 220 filling the channel hole 130 may be formed by performing a planarization process such as an etch-back process or a CMP process in the upper part of the insulating layer 110 positioned at the uppermost end.

After the planarization process, the insulating layer 110 positioned at the uppermost end may include the first impurity according to an ion injection depth of the ion injection process performed in FIG. 8.

The vertical channel pattern 220 may be formed in the channel hole 130 in the pipe shape in which one end (e.g., the end closest to the lower semiconductor pattern 140) is closed, the hollow cylindrical shape in which one end is closed, or the cup shape. The filling insulating pattern 230 may be formed in a pillar shape to be within and, in some embodiments, fill the inside of the channel hole 130 in which the vertical channel pattern 220 is formed. The vertical insulating pattern 210, the vertical channel pattern 220, and the filling insulating pattern 230 may constitute the vertical pattern structure VS.

In addition, the conductive pad 240 may be formed, which is connected to the vertical pattern structure VS. The conductive pad 240 may be formed by filling a conductive material on the vertical pattern structure VS which is recessed based on the top of the insulating layer 110 positioned in the uppermost part of the plurality of insulating layers 110. In some embodiments, the conductive pad 240 may be made of polysilicon and/or metal doped with impurities having the same conductive type as the substrate 100. As illustrated in FIG. 15, the top formed by the uppermost insulating layer 110, the vertical pattern structure VS, and the conductive pad 240 may be planarized.

Figure 16:
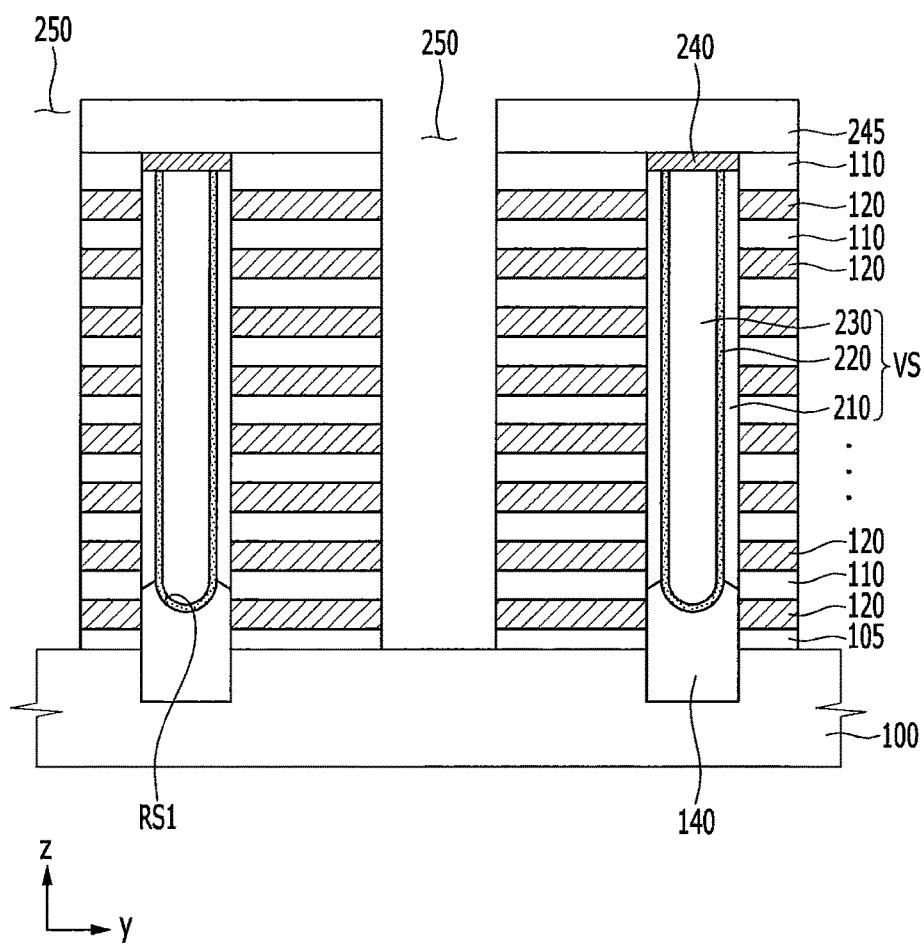

As illustrated in FIG. 16, the capping layer 245 may be formed and thereafter, the capping layer 245, the insulating layers 110, the sacrificial layers 120, and the lower insulating layer 105 may be anisotropically etched between adjacent vertical pattern structures VS, and, as a result, a trench 250 may be formed. In detail, forming the trench 250 may include forming a second mask pattern (not illustrated) defining a planar position where the trench 250 is to be formed in the plurality of insulating layers 110 and the plurality of sacrificial layers 120, and etching the plurality of insulating layers 110 and the plurality of sacrificial layers 120 by using a second mask pattern as an etching mask. Thereafter, the second mask pattern may be removed.

The trench 250 may be formed to expose the side walls of the sacrificial layers 120 and the insulating layers 110. In a vertical depth, the trench 250 may be formed to expose the side wall of the lower insulating layer 105. Further, although not illustrated, the trench 250 may have a different width depending on the distance from the substrate 100 by the anisotropic etching process.

The trench 250 may extend in the x direction. The lateral surfaces of the capping layer 245, the insulating layers 110, the sacrificial layers 120, and the lower insulating layer 105 may be exposed to the inner wall of the trench 250.

Figure 17:
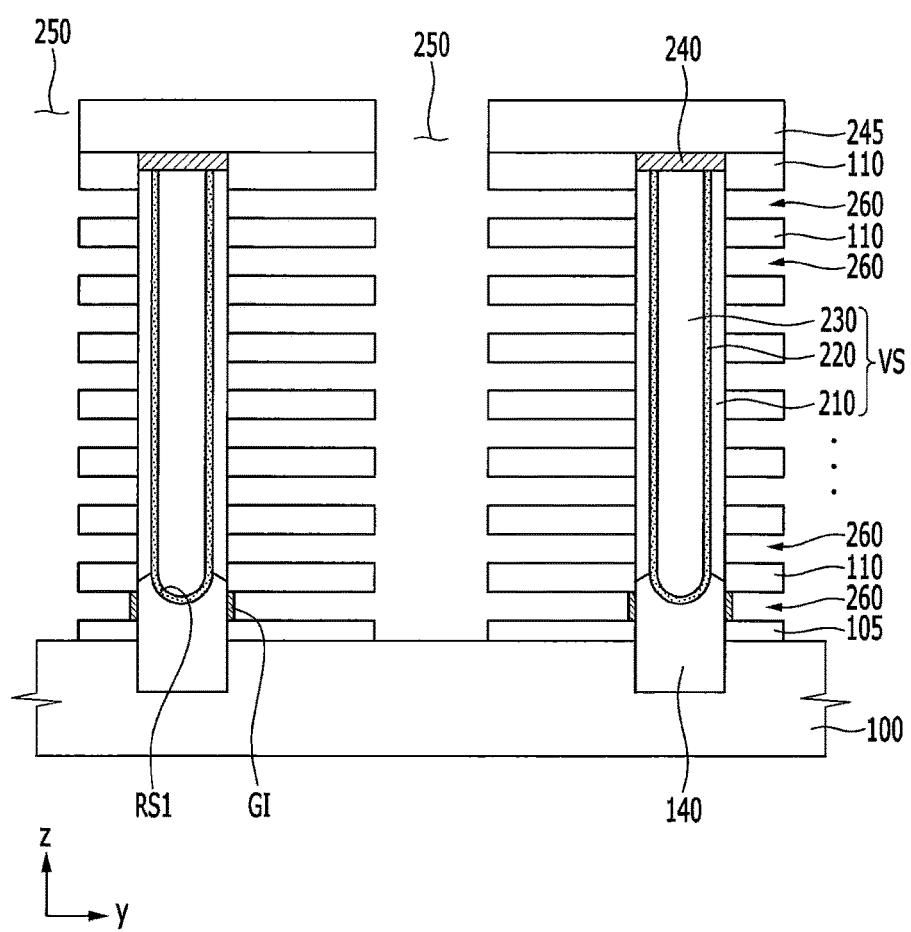

Next, as illustrated in FIG. 17, the sacrificial layer 120 exposed by the trench 250 is selectively removed to form a gap 260 between the insulating layers 110. The gap 260 may correspond to regions where the sacrificial layers 120 are removed. When the sacrificial layer 120 includes the silicon nitride layer or the silicon oxynitride layer, the removing process of the sacrificial layers 120 may be performed by using the etching solution including phosphoric acid. A part of the outer surface of the vertical pattern structure VS may be exposed by the gap 260. Further, a part of the outer surface of the lower semiconductor pattern 140 may be exposed by the gap 260.

Figure 18:
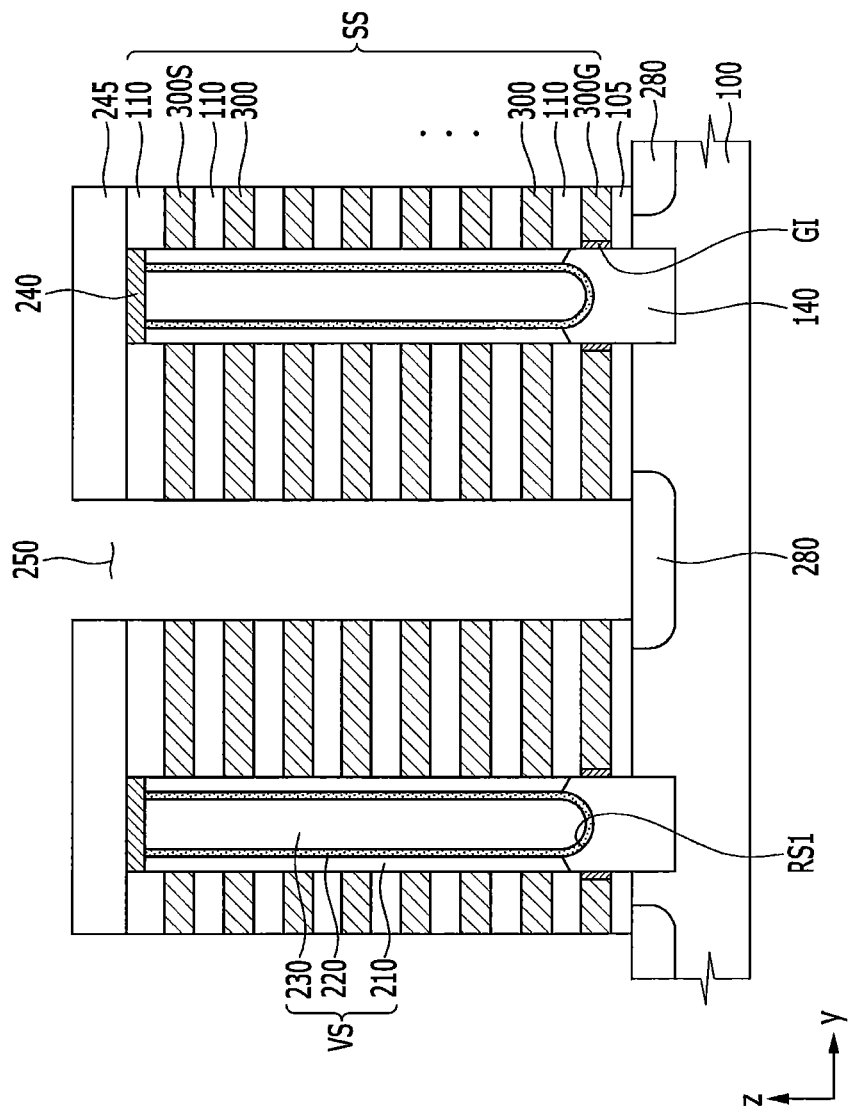

Next, as illustrated in FIG. 18, a gate electrode 300 filling the gap 260 may be formed. In detail, a conductive layer may be formed to not completely fill the trench 250 while filling the gap 260. Thereafter, the plurality of gate electrodes 300 may be formed, which are positioned in the gap 260 by removing the conductive layer formed at the outside (e.g., within the trench 250) of the gap 260. The plurality of gate electrodes 300 and the plurality of insulating layers 110 which are stacked may constitute the stacking structure SS.

In some embodiments, prior to forming the gate electrode 300, the gate insulating layer GI may be formed between the lower semiconductor pattern 140 and the gate electrode 300G positioned at the lowermost end. The gate insulating layer GI may be formed by performing the oxidization process on the outer surface of the lower semiconductor pattern 140 exposed by the gap 260 (see FIG. 17). In some embodiments, the formation of the gate insulating layer GI may be omitted.

Figure 19:
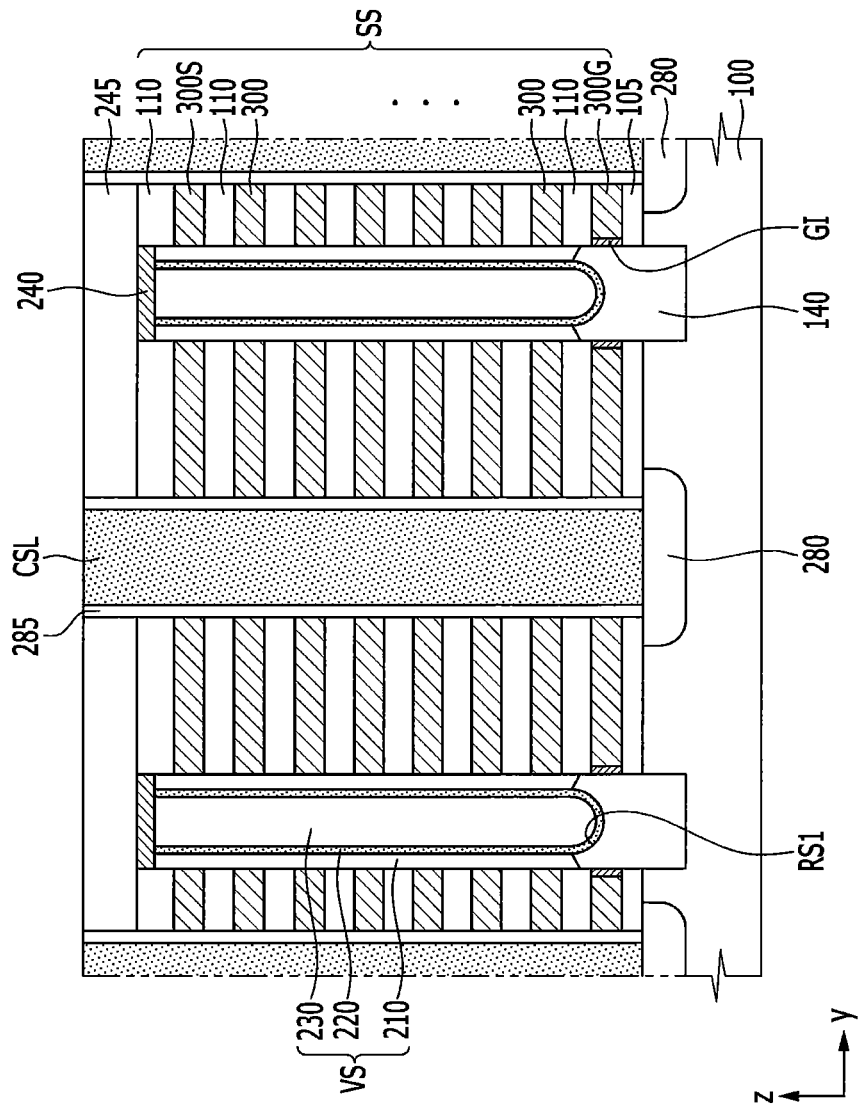

Next, as illustrated in FIG. 19, the common source region 280 may be formed on the substrate 100. The common source region 280 may be formed by an ion injection process in the substrate 100 exposed by the trench 250. The common source region 280 may configure a PN junction with the substrate 100.

Next, a trench spacer 285 may be formed on the side wall of the trench 250 and the common source line CSL which extends in the x direction while filling the trench 250 may be formed. The common source line CSL may be electrically connected by contacting the common source region 280. The trench spacer 285 may electrically insulate the plurality of gate electrodes 300 and the common source line CSL. The trench spacer 285 may include an insulating material such as silicon oxide and/or nitride. The common source line CSL may include metallic materials such as tungsten, titanium, tantalum, platinum, and/or metal silicide.

Figure 20:
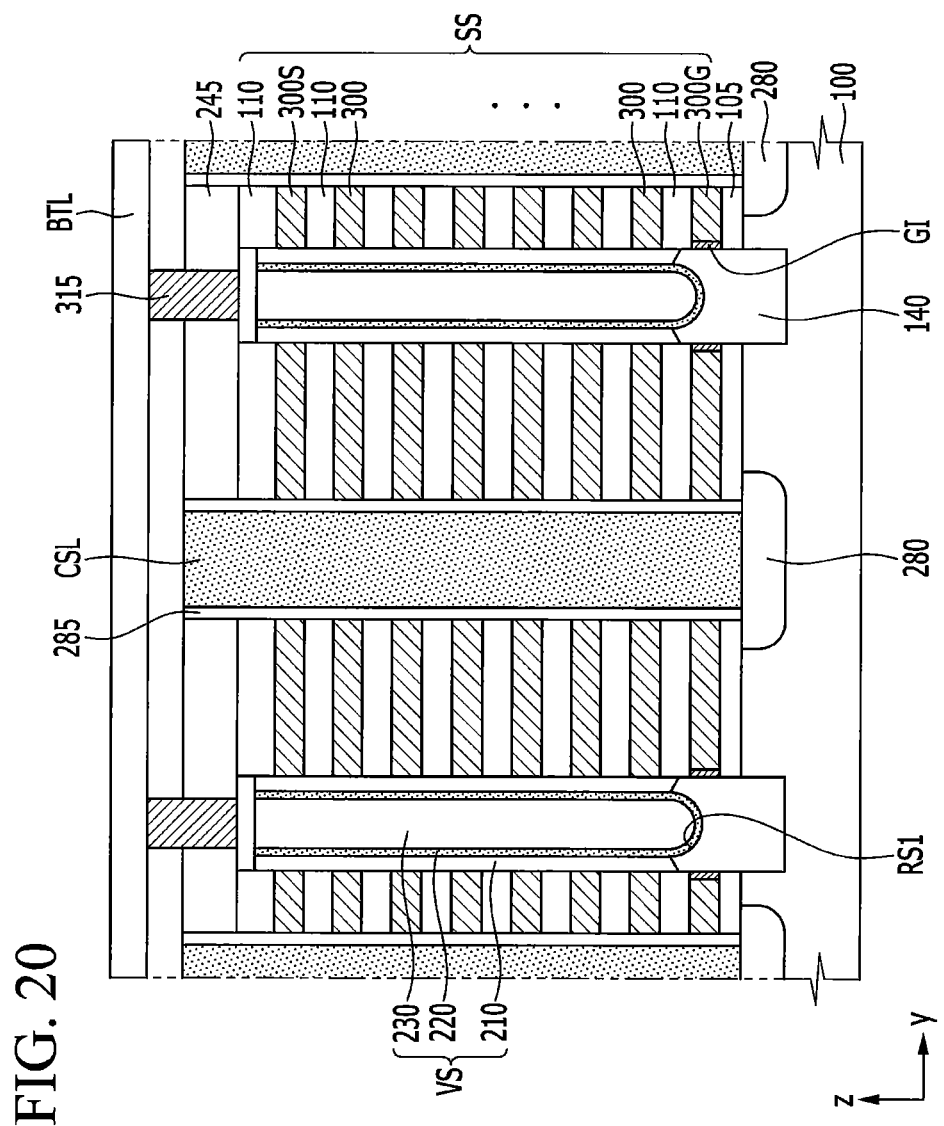

The bit line contact 315 which is connected to the conductive pad 240 illustrated in FIG. 20 may be formed. The bit line contact 315 may include metal such as tungsten and/or copper. Thereafter, the bit line BTL which contacts the top of the bit line contact 315 and extends in the y direction may be formed. The bit line BTL may include the metal such as the tungsten and/or copper.

Hereinafter, manufacturing methods of the semiconductor memory devices according to other example embodiments of the present inventive concepts will be described with reference to FIGS. 21A and 21B. Description of the same or similar processes as FIGS. 5 to 20 will be omitted.

First, the same manufacturing processes as FIGS. 5 to 7 are performed.

Thereafter, the lower semiconductor layer LSL may be doped with the second impurity. The second region LSL2 including the second impurity may be formed in the lower semiconductor layer LSL. The second impurity may be the same conductive impurity as the substrate 100.

Next, as illustrated in FIG. 9A, the vertical insulating layer 210a may be formed, which covers the inner wall of the channel hole 130 and covers the top of the lower semiconductor layer LSL.

Figure 21A:
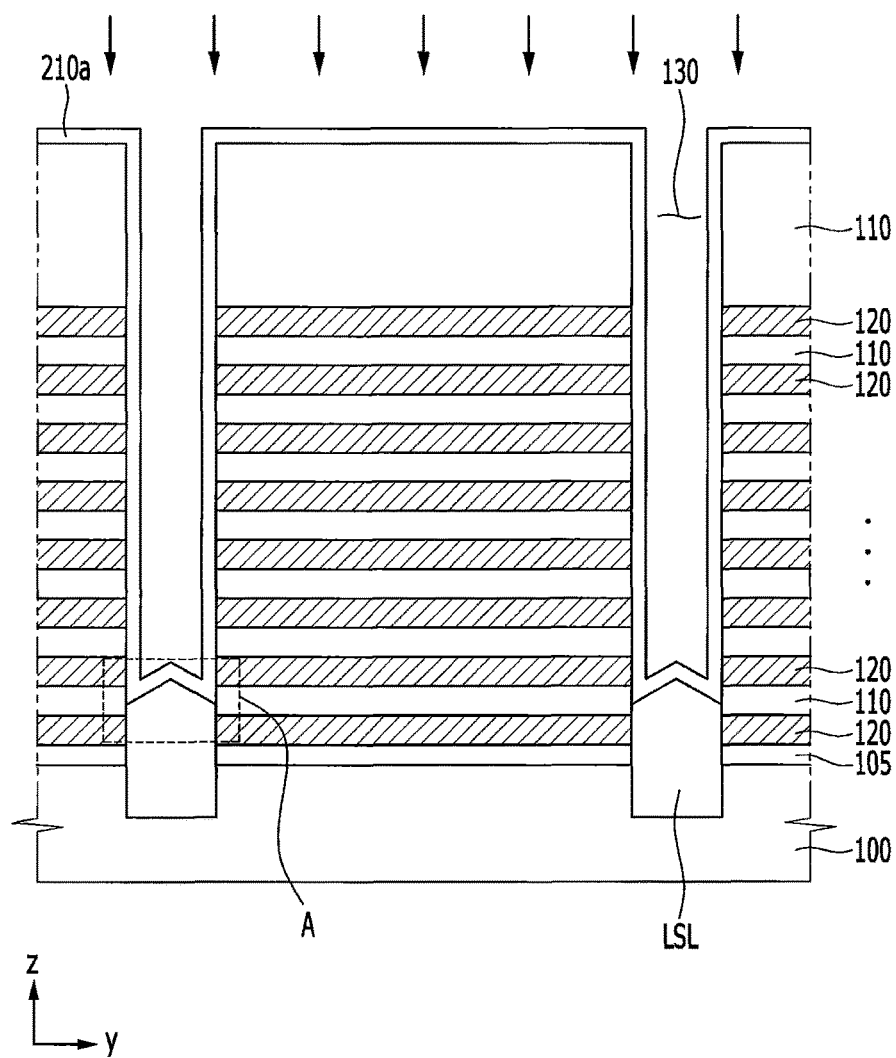
FIGS. 21A and 21B are a cross-sectional view and an enlarged diagram, respectively, for describing methods for manufacturing semiconductor memory devices according to example embodiments of the present inventive concepts.
Figure 21B:
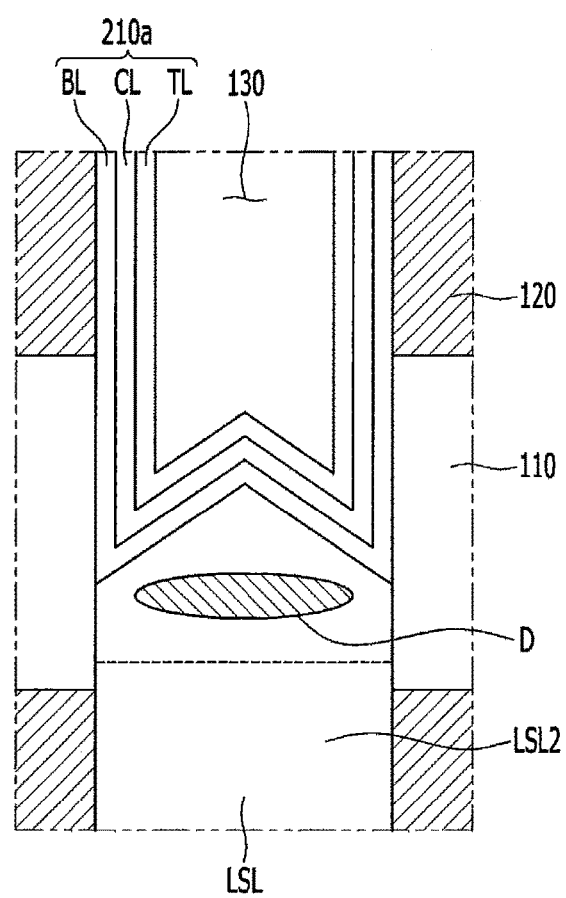

Thereafter, as illustrated in FIGS. 21A and 21B, the ion injection process may be performed with respect to the top surface of the substrate 100 on the vertical insulating layer 210a. The lower semiconductor layer LSL may include a first region D including a first impurity through the ion injection process. The first impurity may be at least one of C, N, O, Cl, F, B, Ph, and As. Among them, C, N, O, and Cl may be more appropriate.

The width of the first region D may be smaller than that of a second region LSL2. In FIG. 21A, when the ion injection process of the first impurity is performed with respect to the top surface of the substrate 100, the first region D may be formed in a region which overlaps with the channel hole 130. In some embodiments, the first region D may have a width less than or equal to the width of the channel hole 130.

Meanwhile, the second region LSL2 may be formed by injecting a second impurity into the channel hole 130 in which the vertical insulating layer 210a is not formed as illustrated in FIG. 8. The width of the second region LSL2 may substantially match the width of the channel hole 130 according to FIG. 8.

Accordingly, the first region D may be formed to have a smaller width than the second region LSL2.

Thereafter, the processes illustrated and described through FIGS. 10A to 20 may be similarly performed.

Figure 22:
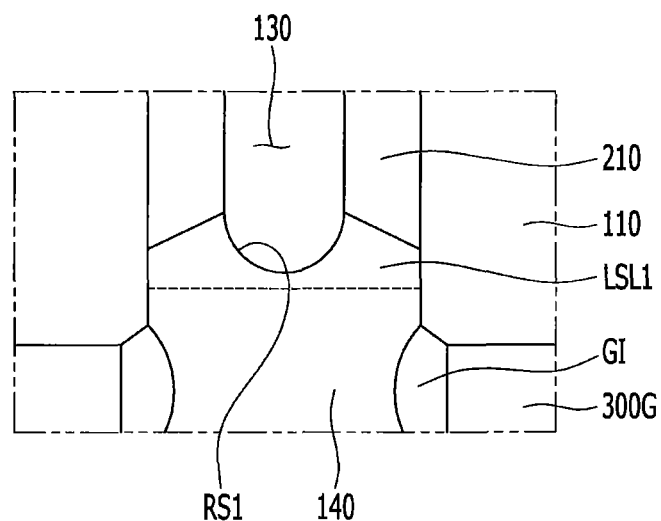
FIG. 22 is a diagram illustrating a cross-sectional shape of a lower semiconductor pattern according to an example embodiment of the present inventive concepts.
Figure 24:
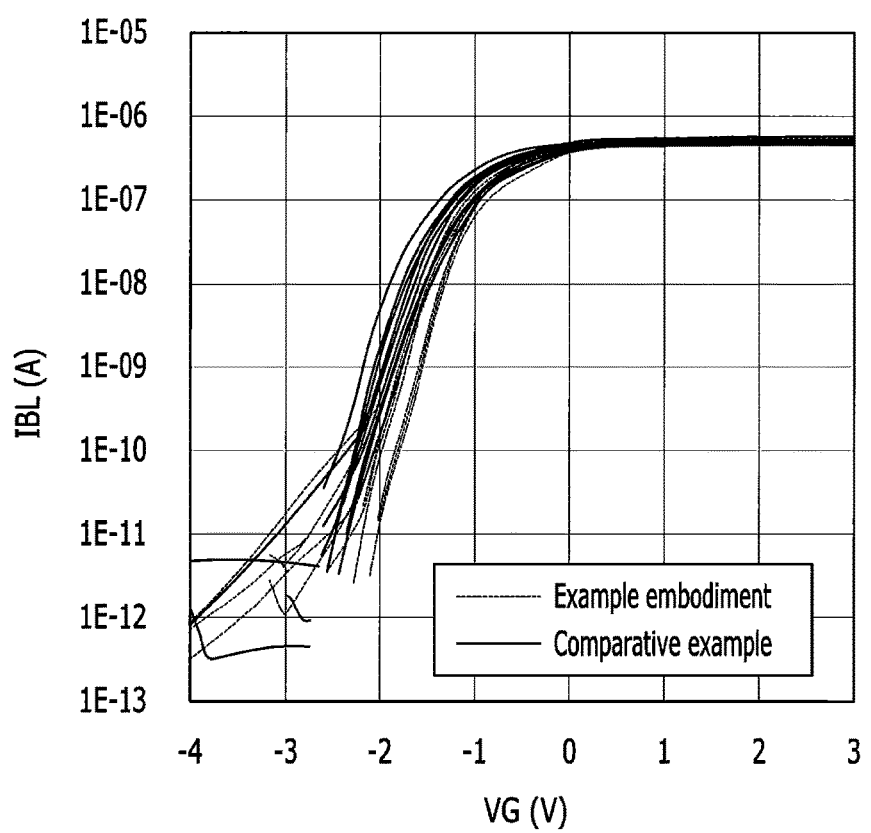
FIG. 24 is a graph illustrating current depending on gate voltage applied to the example embodiment of FIG. 22 and the comparative example of FIG. 23.
Figure 25:
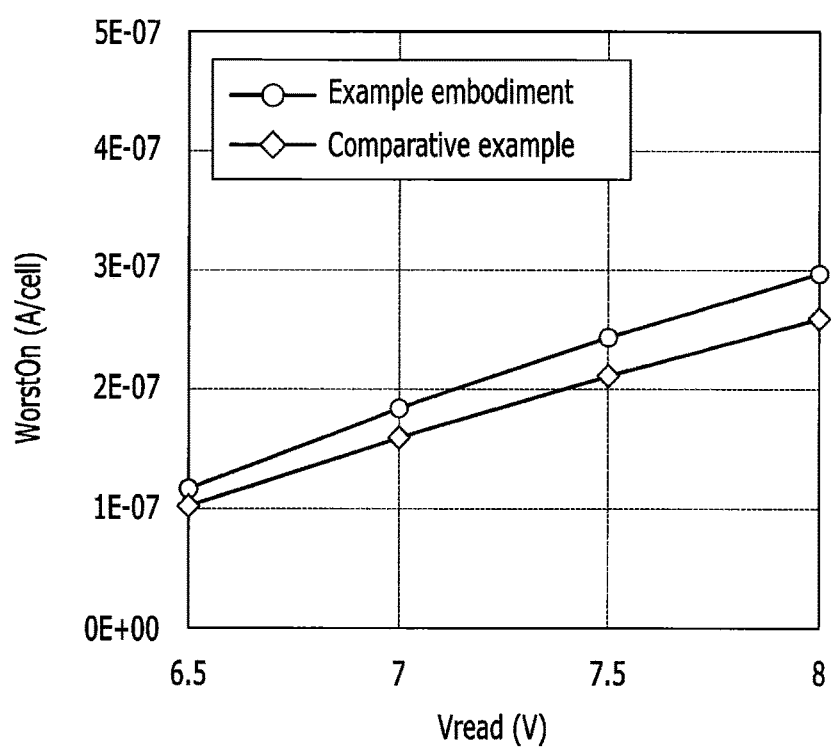
FIG. 25 is a graph illustrating a worst on-cell current characteristic.

Hereinafter, a semiconductor memory characteristic according to an example embodiment and a comparative example will be described with reference to FIGS. 22 to 25. FIG. 22 is a diagram illustrating a cross-sectional shape of a lower semiconductor pattern according to an example embodiment of the present inventive concepts and FIG. 23 is a diagram illustrating a cross-sectional shape of a lower semiconductor pattern according to a comparative example, FIG. 24 is a graph illustrating applied current to gate voltage applied to the example embodiment of FIG. 22 and the comparative example of FIG. 23, and FIG. 25 is a graph illustrating a worst on-cell current characteristic.

According to the example embodiment, in the semiconductor memory device including the first region LSL1 doped with carbon C, the widest portion of the first recess region RS1 included in the lower semiconductor pattern 140 may have substantially the same diameter as the channel hole 130 as illustrated in FIG. 22.

In the process of removing the sacrificial channel layer (see reference numeral 220a of FIG. 11A) contacting the vertical insulating pattern 210, the etching solution removing the sacrificial channel layer may etch even the lower semiconductor pattern 140 exposed by the channel hole 130. However, the semiconductor memory device according to the example embodiment includes the first region LSL1, and as a result, the overetching of the lower semiconductor pattern 140 by the etching solution may be prevented and the first recess region RS1 of the lower semiconductor pattern 140 may form a plane having substantially the same size as the channel hole 130 on which the vertical channel layer is deposited afterwards. As a result, the channel may be stably formed in spite of the vertical channel pattern which is formed with a small thickness.

Figure 23:
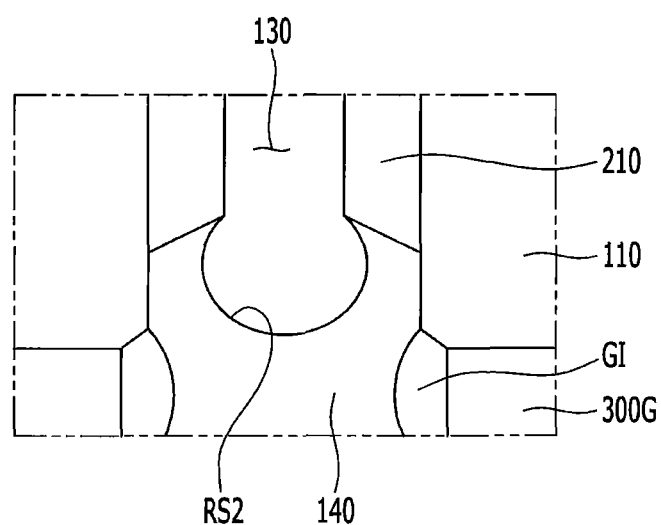
FIG. 23 is a diagram illustrating a cross-sectional shape of a lower semiconductor pattern according to a comparative example.

However, the semiconductor memory device according to the comparative example, which does not include the first region LSL1 (see FIG. 22) may overetch the upper part of the lower semiconductor pattern 140 exposed by the etching solution used in the process of removing the sacrificial channel layer as illustrated in FIG. 23. As a result, the lower semiconductor pattern 140 of the comparative example includes a recess region RS2 having a larger diameter at its widest point than the channel hole 130, and when the vertical channel layer is deposited on the recess region RS2, there is a high possibility that the channel will be disconnected between the lower semiconductor pattern 140 and the vertical insulating pattern 210 and reliability of the device may deteriorate.

Meanwhile, FIG. 24 illustrating the current which flows according to the applied voltage illustrates that an on-off characteristic of a memory cell is excellent as a slope of the graph is large. According to FIG. 24, it can be seen that the graph slope of the semiconductor memory device according to the example embodiment is formed to be larger than the graph slope of the semiconductor memory device according to the comparative example. The semiconductor memory device according to the example embodiment of the present inventive concepts includes the first region LSL1, and as a result, it can be seen that the on-off characteristic of the semiconductor memory device including the stable vertical channel pattern is improved as compared with the comparative example.

Further, the graph regarding the worst on-cell current characteristic illustrated in FIG. 25 is a graph illustrating current which flows in the corresponding cell at the time of applying the same voltage. Referring to the graph, it can be seen that the example embodiment has a higher current value than the comparative example when voltage is applied to each memory cell. This means that higher current may flow in the memory cell according to the example embodiment when the same voltage is applied to each memory cell, and as a result, it can be seen that an electrical characteristic of the semiconductor memory devices according to the present inventive concepts are improved.

Figure 26:
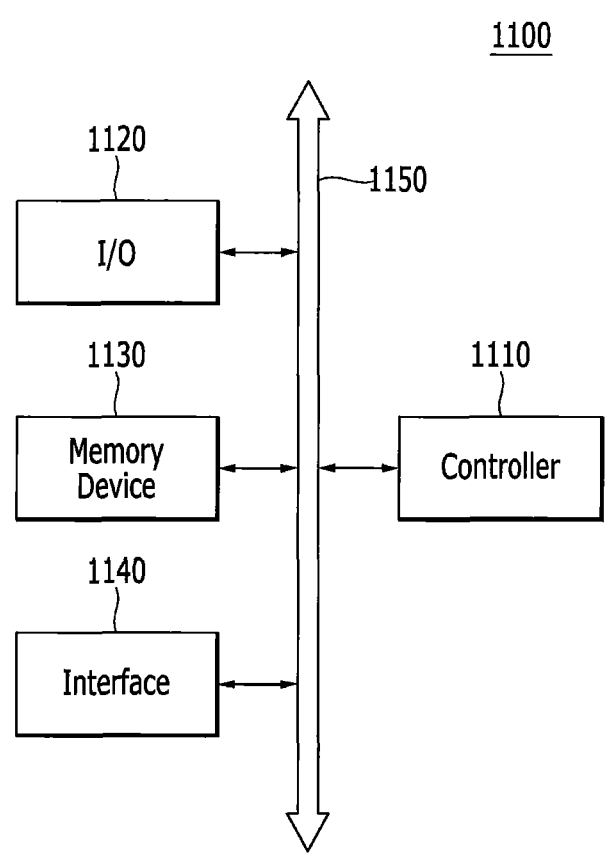
FIG. 26 is a block diagram schematically illustrating one example of an electronic system including a semiconductor memory device according to example embodiments of the present inventive concepts.
Figure 27:
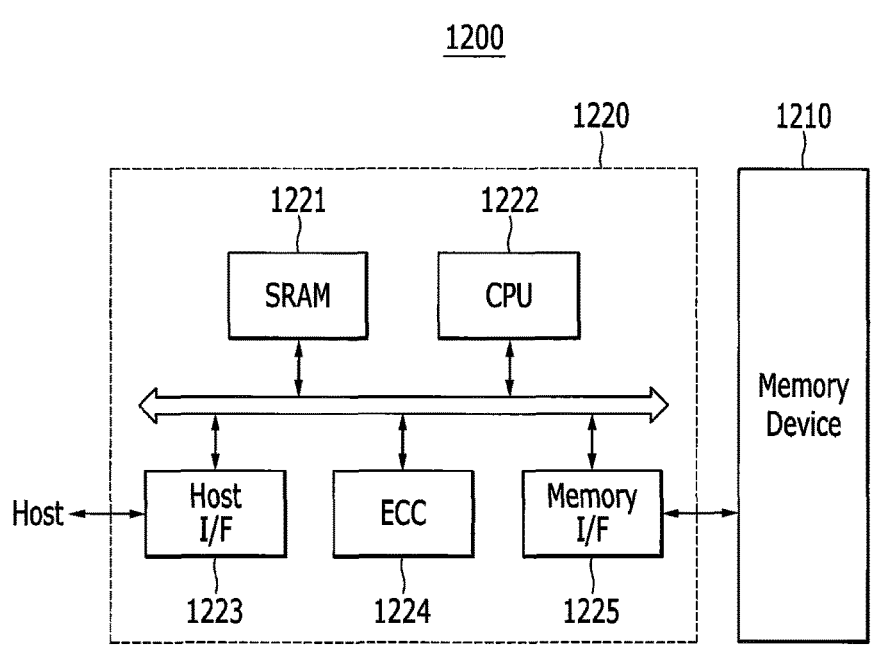
FIG. 27 is a block diagram schematically illustrating one example of a memory card including a semiconductor memory device according to example embodiments of the present inventive concepts.

Hereinafter, an electronic system and a memory card including the semiconductor memory device will be, in brief, described with reference to FIGS. 26 and 27. FIG. 26 is a block diagram schematically illustrating one example of an electronic system including a semiconductor memory device according to example embodiments of the present inventive concepts and FIG. 27 is a block diagram schematically illustrating one example of a memory card including a semiconductor memory device according to example embodiments of the present inventive concepts.

Referring to FIG. 26, the electronic system 1100 according to the example embodiment of the present inventive concepts may include a controller 1110, an input/output device (I/O) 1120, a memory device 1130, an interface 1140, and a bus 1150. At least two of the controller 1110, the input/output device 1120, the memory device 1130, and the interface 1140 may be coupled with each other through the bus 1150. The bus 1150 may correspond to a path where data moves.

The controller 1110 may include at least one of a microprocessor, a digital signal processor, a microcontroller, and/or logic devices capable of performing similar functions thereto. The input/output device 1120 may include a keypad, a keyboard, and/or a display device. The memory device 1130 may store data and/or commands. The memory device 1130 may include the semiconductor memory device disclosed in the aforementioned example embodiments. The memory device 1130 may further include at least one of a phase-change memory device, a magnetic memory device, a DRAM device, and/or an SRAM device. The interface 1140 may perform a function to transmit the data to a communication network and/or receive the data from the communication network. The interface 1140 may be a wired and/or wireless type. For example, the interface 1140 may include an antenna and/or a wired/wireless transceiver. Although not illustrated, the electronic system 1100 may include a memory device for improving an operation of the controller 1110, and may further include at least one of a high-speed DRAM device and/or a high-speed SRAM device.

The electronic system 1100 may be applied to a personal digital assistant (PDA), a portable computer, a web tablet, a wireless phone, a mobile phone, a digital music player, a memory card, and/or and electronic products which may transmit and receive information in a wireless environment.

Referring to FIG. 27, a memory card 1200 according to the example embodiments of the present inventive concepts may include a memory device 1210. The memory device 1210 may include the semiconductor memory device according to the aforementioned example embodiments. The memory device 1210 may further include at least one of the phase-change memory device, the magnetic memory device, the DRAM device, and/or the SRAM device. The memory card 1200 may include a memory controller 1220 which controls data exchange between a host and the memory device 1210.

The memory controller 1220 may include a processing unit 1222 that controls operations of the memory card. Further, the memory controller 1220 may include an SRAM 1221 used as an operation memory of the processing unit 1222. In addition, the memory controller 1220 may further include a host interface 1223 and a memory interface 1225. The host interface 1223 may include a data exchange protocol between the memory card 1200 and the host. The memory interface 1225 may access the memory controller 1220 and the memory device 1210. Furthermore, the memory controller 1220 may further include an error correction block (ECC) 1224. The error correction block 1224 may detect and correct an error of the data read from the memory device 1210. Although not illustrated, the memory card 1200 may further include a ROM device storing code data for interfacing with the host. The memory card 1200 may be used as a portable data storage card. In some embodiments, the memory card 1200 may be implemented as a solid state disk (SSD) which may substitute for a hard disk of a computer system.

In the semiconductor memory device according to the present inventive concepts, the lower semiconductor pattern and the vertical channel pattern stably contact each other, and as a result, the reliability of the semiconductor memory device can be improved. Further, the memory card or the electronic system may include the semiconductor memory device according to the example embodiments to improve an operating speed and electrical characteristics (e.g., noise resistance, and the like) of a system.

It will be understood that although the terms "first," "second," etc. are used herein to describe members, regions, layers, portions, sections, components, and/or elements in example embodiments of the inventive concepts, the members, regions, layers, portions, sections, components, and/or elements should not be limited by these terms. These terms are only used to distinguish one member, region, portion, section, component, or element from another member, region, portion, section, component, or element. Thus, a first member, region, portion, section, component, or element described below may also be referred to as a second member, region, portion, section, component, or element without departing from the scope of the inventive concepts. For example, a first element may also be referred to as a second element, and similarly, a second element may also be referred to as a first element, without departing from the scope of the inventive concepts.

Spatially relative terms, such as "beneath," "below," "lower," "above," "upper" and the like, may be used herein for ease of description to describe the relationship of one element or feature to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented

DESCRIPTION OF SYMBOLS

100: Substrate
110: Insulation layer
140: Lower semiconductor pattern
210: Vertical insulating pattern
220: Vertical channel pattern
300: Memory cell gate electrode
300S: String selection transistor gate electrode
300G: Ground selection transistor gate electrode
RS1: First recess region

What is claimed is:

1. A semiconductor memory device comprising:
a stacking structure comprising a plurality of insulating layers and a plurality of gate electrodes alternately stacked on a substrate;
a lower semiconductor pattern that protrudes from the substrate;
a vertical insulating pattern that extends in a vertical direction from the substrate and penetrates the stacking structure; and
a vertical channel pattern on an inner surface of the vertical insulating pattern and contacting the lower semiconductor pattern,
wherein an upper part of the lower semiconductor pattern includes a recess region including a curve-shaped profile,
wherein, in the recess region, an outer surface of a lower part of the vertical channel pattern contacts the lower semiconductor pattern along a curve of the recess region,
wherein an upper surface of the lower semiconductor pattern is inclined such that a first portion of the upper surface of the lower semiconductor pattern that is nearest to the vertical channel pattern is farther from the substrate than a second portion of the upper surface of the lower semiconductor pattern that is farthest from the vertical channel pattern, and
wherein a first level of a bottom of the vertical channel pattern is lower than the second portion of the upper surface of the lower semiconductor pattern.

2. The semiconductor memory device of claim 1, wherein:
the lower semiconductor pattern has a width that decreases with a distance from the substrate.

3. The semiconductor memory device of claim 1, wherein the first level of the bottom of the vertical channel pattern is higher than a second level of a top surface of a gate electrode of the plurality of gate electrodes that is positioned at a lowermost end among the plurality of gate electrodes.

4. The semiconductor memory device of claim 1, wherein the vertical insulating pattern comprises:
a tunnel insulating layer contacting a surface of an upper part of the vertical channel pattern;

a charge storing layer positioned between the tunnel insulating layer and the stacking structure; and
a blocking insulating layer positioned between the charge storing layer and the stacking structure, and
wherein each of the tunnel insulating layer, the charge storing layer, and the blocking insulating layer comprises a vertical part that extends in the vertical direction to the substrate, and
wherein each of the blocking insulating layer and the charge storing layer comprises a protrusion that is connected with the vertical part thereof and extends on the lower semiconductor pattern.

5. The semiconductor memory device of claim 1, wherein:
a planar inner edge of the vertical insulating pattern is coplanar with a planar outer edge of the vertical channel pattern.

6. The semiconductor memory device of claim 1, wherein the upper part of the vertical channel pattern contacting the vertical insulating pattern has a first thickness,
wherein the lower part of the vertical channel pattern in the recess region has a second thickness, and
wherein the second thickness is larger than the first thickness.

7. The semiconductor memory device of claim 1, wherein the lower part of the vertical channel pattern comprises a curved outer surface.

8. A semiconductor memory device comprising:
a stacking structure comprising a plurality of insulating layers and a plurality of gate electrodes alternately stacked on a substrate;
a lower semiconductor pattern that protrudes from the substrate;
a vertical insulating pattern that extends in a vertical direction to the substrate and penetrates the stacking structure; and
a vertical channel pattern positioned on an inner surface of the vertical insulating pattern and contacting the lower semiconductor pattern,
wherein the lower semiconductor pattern comprises
a first region doped with a first impurity, and
a second region doped with a second impurity, different from the first impurity, having the same conductivity as the substrate.

9. The semiconductor memory device of claim 8, wherein an upper part of the lower semiconductor pattern comprises a recess region including a curve-shaped profile,
wherein the first region is between the recess region and the substrate, and
wherein the first region and a lower part of the vertical channel pattern contact each other in the recess region.

10. The semiconductor memory device of claim 9, wherein the first region comprises a largest content of the first impurity among a plurality of regions of the lower semiconductor pattern that are doped with the first impurity, and
wherein the second region comprises a largest content of the second impurity among a plurality of regions of the lower semiconductor pattern that are doped with the second impurity.

11. The semiconductor memory device of claim 9, wherein a first width of the first region is smaller than a second width of the second region.

12. The semiconductor memory device of claim 9, wherein the first impurity is at least one of C, N, O, Cl, F, B, Ph, and As.

13. The semiconductor memory device of claim 9, wherein a first top surface of the first region is higher than a second top surface of a gate electrode of the plurality of gate electrodes that is positioned at a lowermost end among the plurality of gate electrodes.

14. The semiconductor memory device of claim 13, wherein a third top surface of the second region is lower than the first top surface of the first region.

15. The semiconductor memory device of claim 9, further comprising:
an insulating layer comprising the first impurity at an uppermost end of the plurality of insulating layers.

16. A semiconductor memory device comprising:
a substrate;
a stacking structure comprising a plurality of insulating layers and a plurality of gate electrodes alternately stacked on the substrate;
a lower semiconductor pattern extending in a first direction from the substrate; and
a vertical channel pattern on the lower semiconductor pattern and extending in the first direction from within a recess region of the lower semiconductor pattern;
a vertical insulating pattern extending in the first direction between the vertical channel pattern and the stacking structure,
wherein a first region of the lower semiconductor pattern comprises a first impurity, and
wherein a second region of the lower semiconductor pattern between the first region and the substrate comprises a second impurity different from the first impurity.

17. The semiconductor memory device of claim 16, wherein a bottom surface of the vertical insulating pattern that is closest to the substrate extends between the stacking structure and the vertical channel pattern to contact the vertical channel pattern in a second direction that is inclined with respect to a top surface of the substrate.

18. The semiconductor memory device of claim 17, wherein the vertical insulating pattern comprises:
a blocking insulating layer that is adjacent the stacking structure, wherein the blocking insulating layer comprises a first vertical portion extending in the first direction and a first protrusion contacting the vertical channel pattern;
a tunnel insulating layer extending in the first direction between the blocking insulating layer and the vertical channel pattern; and
a charge storing layer that is between the blocking insulating layer and the tunnel insulating layer, wherein the charge storing layer comprises a second vertical portion extending in the first direction and a second protrusion contacting the vertical channel pattern,
wherein the first protrusion of the blocking insulating layer extends to contact the vertical channel pattern in the second direction that is inclined with respect to the top surface of the substrate.

19. The semiconductor memory device of claim 18, wherein the first protrusion of the blocking insulating layer extends away from the substrate in the second direction from the first vertical portion of the blocking insulating layer to contact the vertical channel pattern.

* * * * *